United States Patent
Jeong

(10) Patent No.: US 12,120,874 B2
(45) Date of Patent: Oct. 15, 2024

(54) SEMICONDUCTOR DEVICES HAVING SEPARATION REGIONS IN GATE ELECTRODE LAYERS, AND DATA STORAGE SYSTEMS INCLUDING THE SAME

(71) Applicant: Samsung Electronics Co., Ltd., Suwon-si (KR)

(72) Inventor: Seonghun Jeong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 381 days.

(21) Appl. No.: 17/583,265

(22) Filed: Jan. 25, 2022

(65) Prior Publication Data

US 2022/0359562 A1 Nov. 10, 2022

(30) Foreign Application Priority Data

May 10, 2021 (KR) .......... 10-2021-0059834

(51) Int. Cl.
| | | |
|---|---|---|
| *H10B 43/27* | (2023.01) | |
| *H10B 41/10* | (2023.01) | |
| *H10B 41/27* | (2023.01) | |
| *H10B 41/35* | (2023.01) | |
| *H10B 41/40* | (2023.01) | |
| *H10B 43/10* | (2023.01) | |
| *H10B 43/35* | (2023.01) | |
| *H10B 43/40* | (2023.01) | |

(52) U.S. Cl.
CPC ............. *H10B 43/27* (2023.02); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ........ H10B 43/27; H10B 41/10; H10B 41/27; H10B 41/35; H10B 43/35
USPC ........................................................ 257/314
See application file for complete search history.

(56) References Cited

U.S. PATENT DOCUMENTS

| | | |
|---|---|---|
| 9,324,730 B2 | 4/2016 | Nam et al. |
| 10,192,880 B2 | 1/2019 | Lee |
| 10,199,498 B2 | 2/2019 | Matsuura et al. |
| 10,475,804 B1 | 11/2019 | Nishikawa et al. |
| 10,475,811 B2 | 11/2019 | Lai et al. |
| 11,792,979 B2 * | 10/2023 | Zhu ..................... H01L 23/5226 257/314 |
| 2013/0256775 A1 | 10/2013 | Shim et al. |

(Continued)

*Primary Examiner* — Quoc D Hoang
(74) *Attorney, Agent, or Firm* — Myers Bigel, P.A.

(57) ABSTRACT

Semiconductor devices may include a gate stack including electrode layers stacked alternately with insulating layers and channel structures in the electrode layers and the insulating layers; a cell region insulating layer and an upper support layer on the gate stack; and a separation region in the gate stack and the cell region insulating layer. The separation regions may include a first separation region in the upper support layer and a second separation region below the upper support layer. The first separation region may include a first region in the upper support layer, a second region in the cell region insulating layer, and a third region in the gate electrode layers. The first separation region may further include has a first bend portion in the second region and a second bend portion that may be higher than the first bend portion and uppermost surfaces of the channel structures.

20 Claims, 22 Drawing Sheets

(56) References Cited

U.S. PATENT DOCUMENTS

2020/0127002 A1    4/2020   Park et al.
2020/0135760 A1    4/2020   Kim et al.
2020/0395373 A1   12/2020   Huo et al.

* cited by examiner

SEMICONDUCTOR DEVICES HAVING SEPARATION REGIONS IN GATE ELECTRODE LAYERS, AND DATA STORAGE SYSTEMS INCLUDING THE SAME

CROSS-REFERENCE TO RELATED APPLICATION(S)

This application claims priority to Korean Patent Application No. 10-2021-0059834 filed on May 10, 2021 in the Korean Intellectual Property Office, the disclosure of which is incorporated herein by reference in its entirety.

BACKGROUND

The present inventive concept relates to a semiconductor device and a data storage system including the same.

In a data storage system requiring data storage, a semiconductor device capable of storing high-capacity data may be beneficial. Accordingly, a method of increasing data storage capacity of a semiconductor device is being researched. For example, as a method for increasing the data storage capacity of a semiconductor device, a semiconductor device including three-dimensionally arranged memory cells, instead of two-dimensionally arranged memory cells, has been proposed.

SUMMARY

An aspect of the present inventive concept is to provide a semiconductor device having improved integration and reliability.

An aspect of the present inventive concept is to provide a data storage system including a semiconductor device having improved integration and reliability.

According to an aspect of the present inventive concept, a semiconductor device may include a substrate; gate electrode layers stacked to be spaced apart from each other in a first direction that may be perpendicular to an upper surface of the substrate; interlayer insulating layers alternately stacked with the gate electrode layers on the substrate in the first direction; channel structures passing through the gate electrode layers and the interlayer insulating layers, extending in the first direction, and including respective channel layers; a cell region insulating layer on (e.g., covering) the gate electrode layers and the channel structures; an upper support layer disposed on the cell region insulating layer; and separation regions passing through the gate electrode layers, the interlayer insulating layers, and the cell region insulating layer, extending in the first direction and in a second direction that may be perpendicular to the first direction and may be spaced apart from each other in a third direction that may be perpendicular to the first and second directions. Each of the separation regions may include a first separation region passing through the upper support layer and extending in the first direction a and second separation region extending onto a lower surface of the upper support layer in the first direction. The first separation region may include a first region passing through the upper support layer, a second region passing through the cell region insulating layer, and a third region passing through the gate electrode layers. The first separation region may further include a first bend portion disposed in the second region and a second bend portion disposed in a position higher than the first bend portion. The second bend portion may be disposed in a position higher than a height of uppermost surfaces of the channel structures. The second separation region may extend between the substrate and the lower surface of the upper support layer in the first direction. The first bend portion may be between the substrate and the second bend portion. The uppermost surfaces of the channel structures may be between the substrate and the second bend portion.

According to an aspect of the present inventive concept, a semiconductor device may include a substrate; gate electrode layers stacked to be spaced apart from each other in a first direction that may be perpendicular to an upper surface of the substrate; interlayer insulating layers alternately stacked with the gate electrode layers on the substrate in the first direction; channel structures passing through the gate electrode layers and the interlayer insulating layers, extending in the first direction, and including respective channel layers; a cell region insulating layer on (e.g., covering) the gate electrode layers and the channel structures; and separation regions passing through the gate electrode layers and the cell region insulating layer and extending in the first direction and in a second direction that may be perpendicular to the first direction. Each of the separation regions may include a first surface and a second surface, both of which may be parallel to the substrate, in a region passing through the cell region insulating layer. A height of the second surface may be higher than a height of the first surface. The first surface may be between the upper surface of the substrate and the second surface.

According to an aspect of the present inventive concept, a data storage system may include a semiconductor storage device including a substrate, circuit elements disposed on one side of the substrate, gate electrode layers stacked to be spaced apart from each other in a first direction that may be perpendicular to an upper surface of the substrate, interlayer insulating layers alternately stacked with the gate electrode layers on the substrate in the first direction, channel structures passing through the gate electrode layers and the interlayer insulating layers, extending in the first direction, and including respective channel layers, a cell region insulating layer on (e.g., covering) the gate electrode layers and the channel structures, separation regions passing through the gate electrode layers and the interlayer insulating layers, and extending in the first direction and in a second direction that may be perpendicular to the first direction, and an input/output pad electrically connected to one of the circuit elements; and a controller electrically connected to the semiconductor storage device through the input/output pad and configured to control the semiconductor storage device. Each of the separation regions may include a first surface and a second surface, both of which may be parallel to the substrate, in a region passing through the cell region insulating layer. A height of the second surface may be higher than a height of the first surface. The first surface may be between the upper surface of the substrate and the second surface.

According to an aspect of the present inventive concept, a method of manufacturing a semiconductor device may include forming a stack structure by alternately stacking sacrificial insulating layers and interlayer insulating layers on a substrate; forming a cell region insulating layer on (e.g., covering) the stack structure; forming a channel structure passing through the stack structure; forming trenches passing through the stack structure, and in (e.g., filling) the trenches with a vertical sacrificial layer; forming an upper support layer on the cell region insulating layer; forming a first opening by etching the upper support layer on a portion of the trenches using a first photomask layer; forming a second opening by etching the upper support layer and the cell region insulating layer, in a region including the first opening, using a second photomask layer; removing the vertical sacrificial layer and the sacrificial insulating layers, and forming gate electrode layers in a space from which the sacrificial insulating layers are removed; and sequentially forming a metal oxide layer, a first separation insulating layer, and a second separation insulating layer in the trenches, the first opening, and the second opening.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1A:
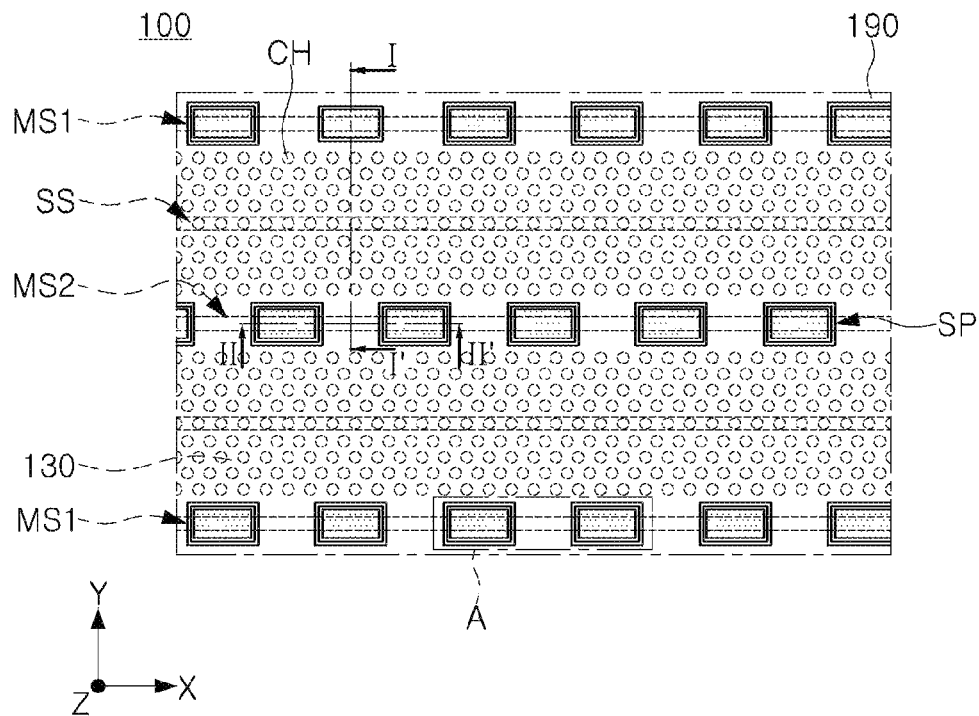
FIGS. 1A and 1B are schematic plan views of a semiconductor device according to example embodiments of the present inventive concept.
Figure 1B:
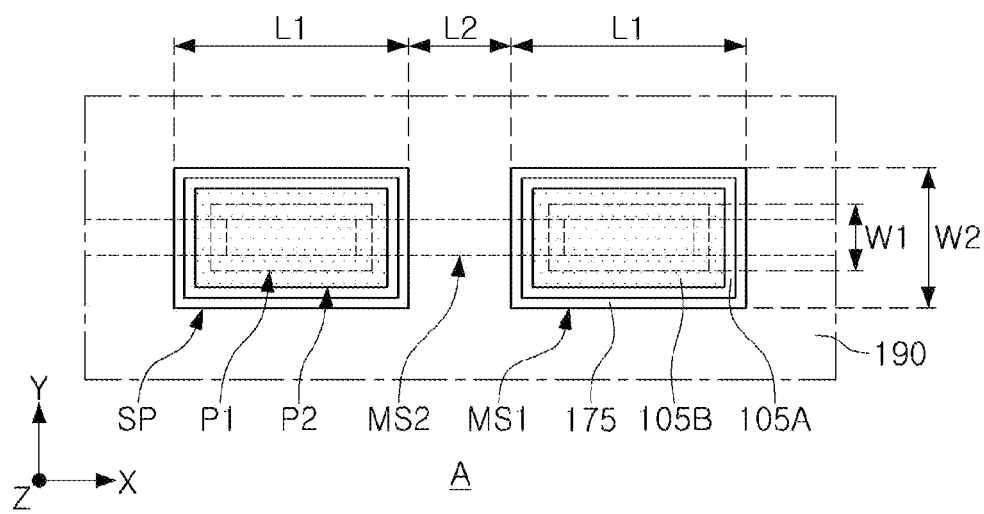

FIG. 1A is a schematic plan view of a semiconductor device according to example embodiments of the present inventive concept. FIG. 1B is an enlarged view of a portion 'A' of FIG. 1A according to example embodiments of the present inventive concept.

Figure 2A:
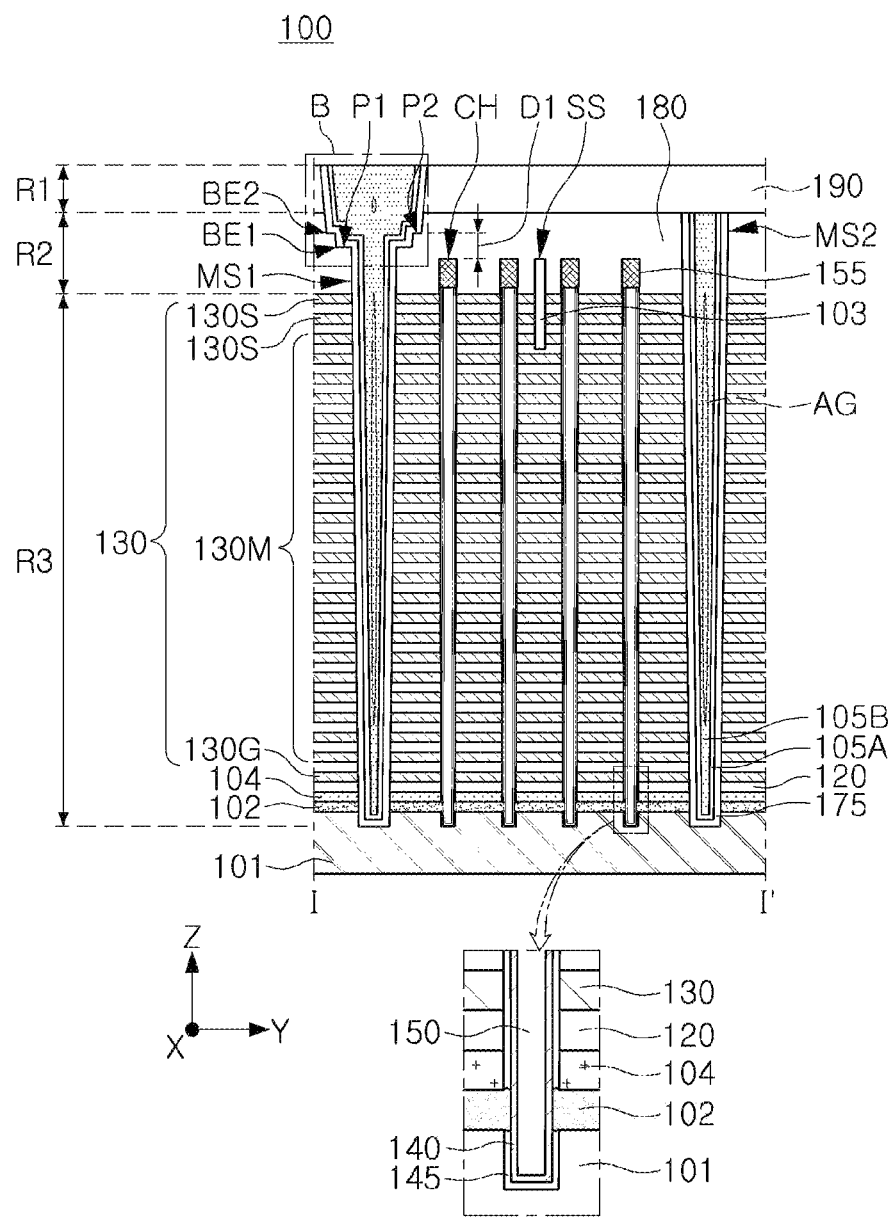
FIGS. 2A and 2B are schematic cross-sectional views of a semiconductor device according to example embodiments of the present inventive concept.
Figure 2B:
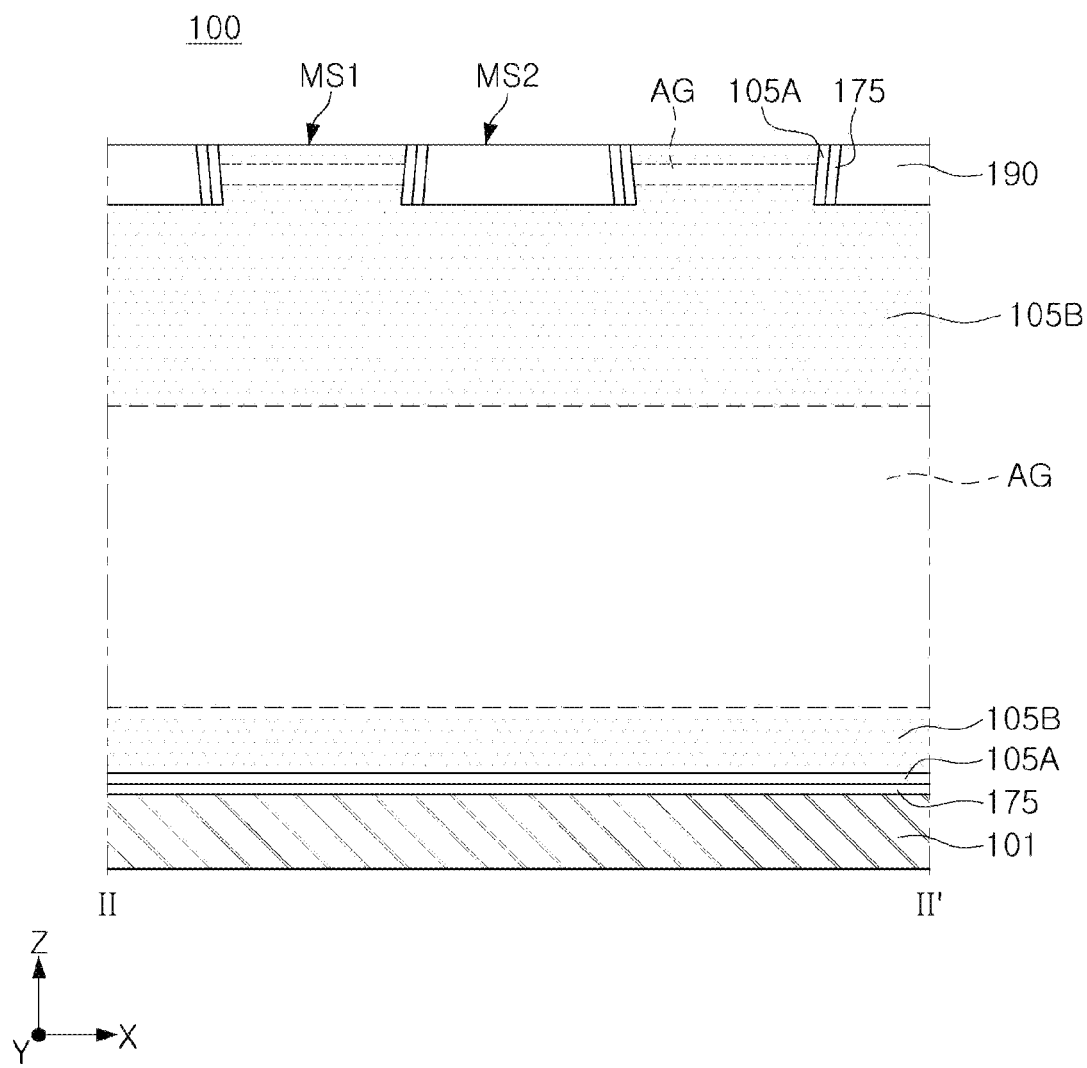

FIGS. 2A and 2B are schematic cross-sectional views of a semiconductor device according to example embodiments of the present inventive concept. FIG. 2A illustrates a cross-sectional view taken along a line I-I' of FIG. 1A, and FIG. 2B illustrates a cross-sectional view taken along a line II-II' of FIG. 1A.

Figure 3:
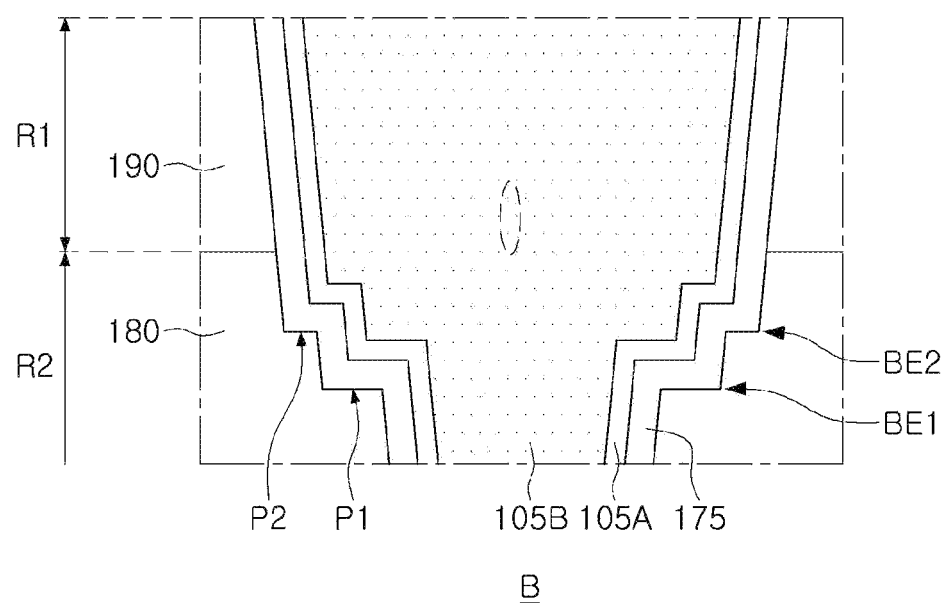
FIG. 3 is an enlarged view of a portion of a semiconductor device according to example embodiments of the present inventive concept.

FIG. 3 is an enlarged view of a portion 'B' of FIG. 2A according to example embodiments of the present inventive concept.

Referring to FIGS. 1A to 3, a semiconductor device 100 may include a substrate 101, first and second horizontal conductive layers 102 and 104 on the substrate 101, gate electrode layers 130 stacked on the substrate 101, interlayer insulating layers 120 alternately stacked with the gate electrode layers 130 on the substrate 101, channel structures CH passing through a stack structure formed of the gate electrode layers 130 and including, respectively, channel layer 140, an upper separation regions SS passing through a portion of the stack structure, a cell region insulating layer 180 covering the gate electrode layers 130 and the channel structures CH, an upper support layer 190 disposed on the cell region insulating layer 180, and separation regions MS1 and MS2 extending through the stack structure.

In the semiconductor device 100, a memory cell string may be configured around each of the channel structures CH, and a plurality of memory cell strings may be arranged in columns and rows in an X direction and an Y direction.

The substrate 101 may have an upper surface extending in the X direction and the Y direction. The upper surface of the substrate 101 may be a surface facing the gate electrode layers 130 and may be parallel to the X direction and the Y direction. The X direction and the Y direction may be a first horizontal direction and a second horizontal direction, respectively. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

The first and second horizontal conductive layers 102 and 104 may be stacked on the upper surface of the substrate 101. The first horizontal conductive layer 102 may function as at least a portion of a common source line of the semiconductor device 100, and may function, for example, as a common source line together with the substrate 101. As illustrated in the enlarged view of FIG. 2A, the first horizontal conductive layer 102 may be directly connected to the channel layer 140.

The first and second horizontal conductive layers 102 and 104 may include a semiconductor material, such as polycrystalline silicon. In this case, at least, the first horizontal conductive layer 102 may be a layer doped with impurities of the same conductivity type as the substrate 101, and the second horizontal conductive layer 104 may be a doped layer or a layer containing impurities diffused from the first horizontal conductive layer 102. A material of the second horizontal conductive layer 104 is not limited to a semiconductor material and may be replaced with an insulating layer in some embodiments.

The gate electrode layers 130 may be stacked to be vertically spaced apart from each other on the substrate 101, to form the stack structure. The gate electrode layers 130 may include a lower gate electrode layer 130G forming a gate of a ground select transistor, memory gate electrode layers 130M forming a plurality of memory cells, and upper gate electrode layers 130S forming gates of string select transistors. The number of memory gate electrode layers 130M forming memory cells may be determined according to capacity of the semiconductor device 100. According to some embodiments, the upper and lower gate electrode layers 130S and 130G may be one or two or more, respectively, and may have the same or different structures as the memory gate electrode layers 130M. In example embodiments, the gate electrode layers 130 may further include a gate electrode disposed above the upper gate electrode layers 130S and/or below the lower gate electrode layer 130G, and forming an erase transistor used in an erase operation using a gate induced drain leakage (GIDL) phenomenon. In addition, a portion of the gate electrode layers 130, for example, memory gate electrode layers 130M, adjacent to the upper or lower gate electrode layers 130S and 130G, may be dummy gate electrode layers.

The gate electrode layers 130 may include a metal material, for example, tungsten (W). In some embodiments, the gate electrode layers 130 may include polycrystalline silicon and/or a metal silicide material. In example embodiments, the gate electrode layers 130 may further include a diffusion barrier, and, for example, the diffusion barrier may include tungsten nitride (WN), tantalum nitride (TaN), titanium nitride (TiN), or a combination thereof.

The interlayer insulating layers 120 may be disposed between the gate electrode layers 130. In a similar manner to the gate electrode layers 130, the interlayer insulating layers 120 may be disposed to be spaced apart from each other in a direction, perpendicular to the upper surface of the substrate 101. For example, the interlayer insulating layers 120 may be alternately stacked with the gate electrode layers 130. The interlayer insulating layers 120 may include an insulating material such as silicon oxide and/or silicon nitride.

Each of the channel structures CH may form a memory cell string and may be disposed on the substrate 101 to be spaced apart from each other while forming rows and columns. The channel structures CH may be disposed to form a grid pattern on an X-Y plane or may be disposed in a zigzag shape in one direction. The channel structures CH may have a pillar shape and may have inclined side surfaces such that widths of the channel structures become narrower as they get closer to the substrate 101, according to an aspect ratio. As illustrated in the enlarged view of FIG. 2A, each of the channel structures CH may further includes a gate dielectric layer 145, a buried channel insulating layer 150 between the channel layers 140, and a channel pad 155 in an upper portion of each of the channel structures CH, in addition to the channel layer 140.

The channel layer 140 may be formed to have an annular shape surrounding the buried channel insulating layer 150 therein but may have a pillar shape such as a cylinder or a prism without the buried channel insulating layer 150 in some embodiments. The channel layer 140 may be connected to the first horizontal conductive layer 102 in a lower portion thereof. The channel layer 140 may include a semiconductor material such as polycrystalline silicon and/or single crystal silicon, and the semiconductor material may be an undoped material or a material containing p-type or n-type impurities.

The gate dielectric layer 145 may be disposed between the gate electrode layers 130 and the channel layer 140. Although not specifically illustrated, the gate dielectric layer 145 may include a tunneling layer, a charge storage layer, and a blocking layer, sequentially stacked from the channel layer 140. The tunneling layer may tunnel electrical charges to the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In example embodiments, at least a portion of the gate dielectric layer 145 may extend in a horizontal direction along each of the gate electrode layers 130. As used herein, "an element A extends in a direction X" (or similar language) may mean that the element A extends longitudinally in the direction X.

The channel pads 155 may be disposed on the channel layer 140 in the channel structures CH. The channel pads 155 may be disposed to cover an upper surface of the buried channel insulating layer 150 and may be electrically connected to the channel layer 140, respectively. The buried channel insulating layer 150 may be in contact with the channel layer 140 and/or the gate dielectric layer 145. The channel pads 155 may include, for example, doped polycrystalline silicon.

The upper separation regions SS may extend in the X direction between the separation regions MS1 and MS2 adjacent in the Y direction. The upper separation regions SS may be disposed to pass through a portion of the gate electrode layers 130 including an uppermost gate electrode layer 130, among the gate electrode layers 130. As illustrated in FIG. 2A, the upper separation regions SS may separate, for example, a total of three gate electrode layers 130 from each other in the Y direction. The number of gate electrode layers 130 separated by the upper separation regions SS may be variously changed in some embodiments. The upper separation regions SS may include an upper separation insulating layer 103.

The cell region insulating layer 180 may be disposed to cover the gate electrode layers 130 and the channel structures CH. The cell region insulating layer 180 may include a plurality of insulating layers in some embodiments. The cell region insulating layer 180 may be formed of an insulating material, and may include, for example, at least one of silicon oxide, silicon nitride, or silicon oxynitride.

The upper support layer 190 may be disposed on the separation regions MS1 and MS2 and the cell region insulating layer 180, and may have openings SP. As illustrated in FIGS. 1A and 1B, a first separation region MS1 may be disposed in the openings SP of the upper support layer 190. The openings SP may be disposed at regular intervals in the X direction, which may be an extending direction of the separation regions MS1 and MS2. The openings SP are illustrated in a rectangular shape in a plan view, but are not limited thereto, and may have a rounded shape depending on process conditions.

The upper support layer 190 may be formed of an insulating material, and may include, for example, at least one of silicon oxide, silicon nitride, or silicon oxynitride. The upper support layer 190 may be formed of the same material as or a different material from the cell region insulating layer 180. Even when the upper support layer 190 is formed of the same material as the cell region insulating layer 180, the upper support layer 190 may be formed by different process operations to distinguish a boundary therebetween. When the upper support layer 190 is formed of the same material as the cell region insulating layer 180 not to distinguish the boundary therebetween, a first region R1 and a second region R2 may be distinguished by upper surfaces of second separation regions MS2.

A metal oxide layer 175, a first separation insulating layer 105A, and a second separation insulating layer 105B, forming the separation regions MS1 and MS2, may be disposed in the openings SP, as will be described later.

The separation regions MS1 and MS2 may pass through the gate electrode layers 130, the interlayer insulating layers 120, the first and second horizontal conductive layers 102 and 104, and the cell region insulating layer 180, may extend in the X direction, and may be connected to the substrate 101. As illustrated in FIG. 1A, the separation regions MS1 and MS2 may be disposed parallel to each other. The separation regions MS1 and MS2 may be respectively located in trenches extending in the X direction. In other words, the separation regions MS1 and MS2 may be disposed to extend in the X and Z directions and be spaced apart from each other in the Y direction. In some embodiments, each of the the separation regions MS1 and MS2 may extend longitudinally in the X direction as illustrated in FIG. 1A and may protrude from the substrate 101 in the Z direction as illustrated in FIG. 2A. The separation regions MS1 and MS2 may separate the gate electrode layers 130 from each other in the Y direction. The separation regions MS1 and MS2 may have a shape in which widths thereof decrease toward the substrate 101 due to a high aspect ratio. Each of the separation regions MS1 and MS2 may include the metal oxide layer 175 and the separation insulating layers 105A and 105B, disposed in each of the trenches. The separation regions MS1 and MS2 may include first separation regions MS1 extending to pass through the upper support layer 190, and second separation regions MS2 not passing through the upper support layer 190 and extending to a lower surface of the upper support layer 190. The first separation regions MS1 may be disposed to extend in the opening SP of the upper support layer 190. Each of the first separation regions MS1 may include a first region R1 passing through the upper support layer 190, a second region R2 passing through the cell region insulating layer 180, and a third region R3 passing through the gate electrode layers 130. Each of the second separation regions MS2 may include the second region R2 passing through the cell region insulating layer 180 and the third region R3 passing through the gate electrode layers 130. The Z direction may be perpendicular to the upper surface of the substrate 101 and may be a vertical direction.

As illustrated in FIG. 1B, a length of an uppermost surface of each of the first separation regions MS1 in the X direction may be a first length L1, and a length between uppermost surfaces of directly adjacent first separation regions MS1 in the X direction may be a second length L2. A ratio (L1/L2) between the first length L1 and the second length L2 may be, for example, about 0.8 to about 5.0, in particular, for example, about 1.0 to about 4.0. When the ratio (L1/L2) is lower than the above range, difficulty in process of forming the gate electrode layers 130 may increase. When the ratio (L1/L2) is higher than the above range, the interlayer insulating layers 120 may weaken support for the stack structure. For example, a ratio (L1/(L1+L2)) between the first length L1 and a sum of the first length L1 and the second length L2 may be about 40% to about 85%. In some embodiments, the first length L1 may be equal to or greater than the second length L2. It will be understood that the term "directly adjacent" as used herein includes configurations where two "elements" (such as two first separation regions MS1) which are said to be directly adjacent to one another are positioned so that no other like element is located between the two elements which are said to be directly adjacent to one another.

Each of the first separation regions MS1 may include a first bend portion BE1 disposed in the second region R2, and a second bend portion BE2 disposed at a height level, higher than a height level of the first bend portion BE1. In some embodiments, the first bend portion BE1 may be between the substrate 101 and the second bend portion BE2 as illustrated in FIG. 2A. The second bend portion BE2 may be disposed on the height level, higher than height levels of uppermost surfaces of the channel structures CH by a first dimension D1. In some embodiments, the uppermost surfaces of the channel structures CH may be between the substrate 101 and the second bend portion BE2, and the second bend portion BE2 may be spaced apart from the uppermost surfaces of the channel structures CH by the first dimension D1 in the Z direction. In example embodiments, the second bend portion BE2 may be disposed in the region R2. The first bend portion BE1 may be formed to have a relatively low height level by a trimming process or the like, to reduce or eliminate a size of a lower air-gap AG. In some embodiments, the first bend portion BE1 may be disposed in the first region R1, not in the second region R2. As used herein, "an element V is higher than an element W" (or similar language) may mean that the entirety of the element V is higher than the entirety of the element W relative to a substrate.

The first bend portion BE1 may include a first surface P1 parallel to the upper surface of the substrate 101, and the second bend portion BE2 may include a second surface P2 parallel to the upper surface of the substrate 101. In other words, each of the first separation regions MS1 may include a portion in which a width discontinuously and/or abruptly decreases, together with a side surface inclined to decrease a width toward the substrate 101 due to a high aspect ratio. As the first surface P1 and the second surface P2 of each of the first separation regions MS1 may be formed by a trimming process or the like, widths of the first surface P1 and the second surface P2 in a plan view may be constant about an axis in the Z direction. For example, each of the first surface P1 and the second surface P2 may include an inner surface and an outer surface, and the width between the inner surface and the outer surface may be uniformly extended in the Z direction. In example embodiments, each of the first surface P1 and the second surface P2 may have a width between the inner surface and the outer surface in a range of about 50 nm to about 100 nm in a plan view. As illustrated in FIG. 1B, the first separation region MS1 may include a first width W1 on a height level of the first surface P1 in the Y direction, and a second width W2 on a height level of the second surface P2 in the Y direction, and the first width W1 may be narrower than the second width W2. In example embodiments, the first width W1 may be about 220 nm to about 260 nm, and the second width W2 may be about 320 nm to about 460 nm. Referring to FIG. 1B, each of the first surface P1 and the second surface P2 may have a uniform width in a cross-section taken in a plane that is parallel to the upper surface of the substrate, and the width of each of the first surface P1 and the second surface P2 may be in a range of about 50 nm to about 100 nm. Further, that width of each of the first surface P1 and the second surface P2 may be uniform along the Z direction.

A metal oxide layer 175 and separation insulating layers 105A and 105B may be arranged in the first and second separation regions MS1 and MS2. The separation insulating layers 105A and 105B may include a plurality of insulating layers, and may include, for example, a first separation insulating layer 105A and a second separation insulating layer 105B.

The metal oxide layer 175 may be disposed on a lower surface and side surfaces of each of the first and second separation regions MS1 and MS2. The metal oxide layer 175 may be in contact with the cell region insulating layer 180 and the upper support layer 190, as it extends along the side surfaces of the second separation regions MS2 in the Z direction. The metal oxide layer 175 may cover sidewalls of the interlayer insulating layers 120 exposed to the separation regions MS1 and MS2 and may extend horizontally between the interlayer insulating layers 120 to surround at least a portion of a conductive layer forming the gate electrode layers 130. The metal oxide layer 175 may include, for example, a metal oxide such as aluminum oxide.

The separation insulating layers 105A and 105B may be arranged in the first and second separation regions MS1 and MS2 and may be arranged on the metal oxide layer 175. The first separation insulating layer 105A and the second separation insulating layer 105B may be sequentially arranged on the metal oxide layer 175. Side surfaces and a lower surface of the second separation insulating layer 105B may be surrounded by the first insulating layer 105A. The first separation insulating layer 105A may cover at least a portion of the metal oxide layer 175. The second separation insulating layer 105B may be connected to the upper support layer 190. The first insulating layer 105A may include recess portions concaving inwardly toward the gate electrode layers 130.

The second separation insulating layer 105B may have an air-gap AG therein. The air-gap AG may refer to an empty space enclosed and sealed by an insulating material layer constituting the second separation insulating layer 105B. When the second separation insulating layer 105B is formed, an air-gap AG may be formed therein due to high aspect ratios of the separation regions MS1 and MS2. The air-gap AG may have a shape similar to an ellipse extending in the Z direction but is not limited thereto. The air-gap AG may be provided as a plurality of air-gaps AG. A size of the air-gap AG may decrease or may not be present, by increasing a width of the opening SP, after forming the first bend portion BE1 and the second bend portion BE2 by a trimming process or the like. Therefore, a semiconductor device including the second separation insulating layer 150B having excellent crack resistance may be provided.

The first separation insulating layer 105A and the second separation insulating layer 105B may include an insulating material, for example, at least one of silicon oxide, silicon nitride, or silicon oxynitride, respectively. The second separation insulating layer 105B may be formed of the same material as or a different material from the first separation insulating layer 105A. Even when the second separation insulating layer 105B is formed of the same material as the first separation insulating layer 105A, the second separation insulating layer 105B may be formed by different process operations to distinguish a boundary therebetween.

Figure 4:
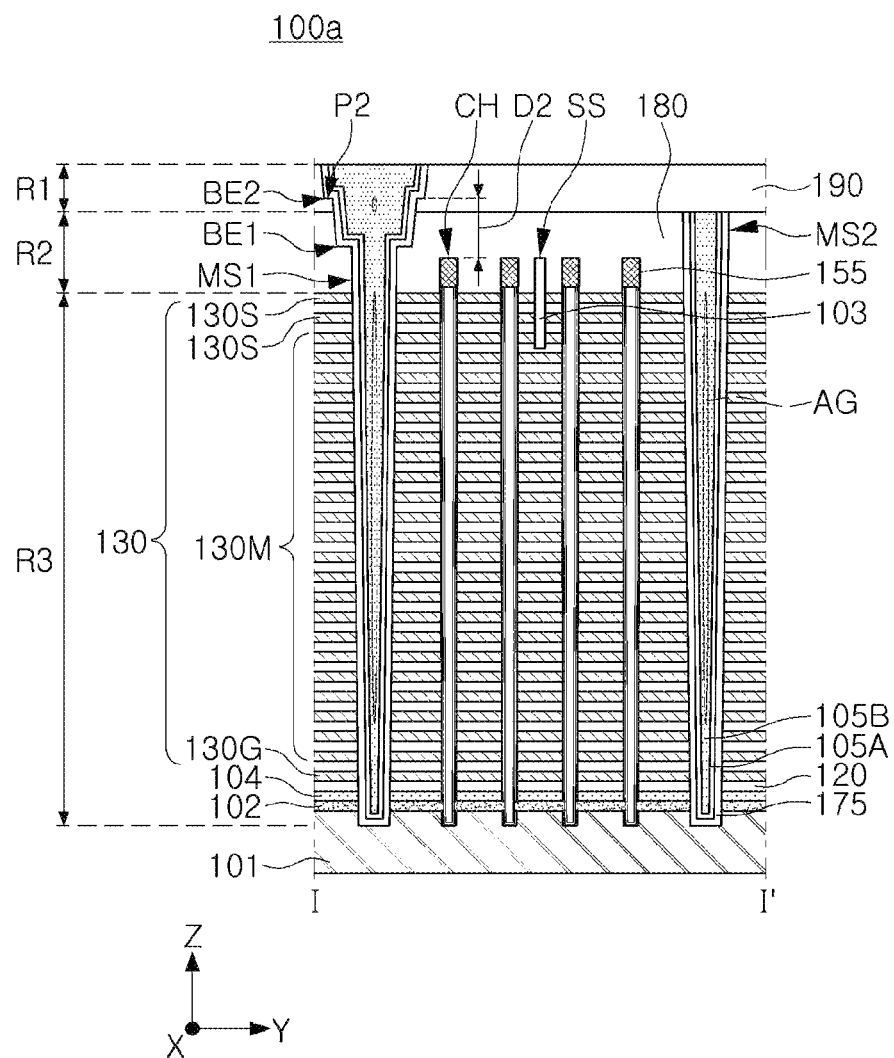
FIG. 4 is a schematic cross-sectional view of a semiconductor device according to example embodiments of the present inventive concept.

FIG. 4 is a schematic cross-sectional view of a semiconductor device according to example embodiments of the present inventive concept.

Referring to FIG. 4, in a semiconductor device 100a, a second bend portion BE2 may be disposed in a first region R1. In other words, a second surface P2 may be disposed on a height level on which an upper support layer 190 is located. Accordingly, a second dimension D2, which may be a difference in height level between upper surfaces of channel structures CH and the second bend portion BE2, may be greater than the first dimension D1, compared to the semiconductor device 100 illustrated in FIG. 2A and FIG. 2B. The second dimension D2 may be provided by thinly forming the opening SP (refer to FIG. 1A) by using a second etching operation in a relatively small amount, compared to the semiconductor device 100 illustrated FIG. 2A and FIG. 2B. As an effect therefrom, a size of an upper air-gap AG may be reduced or eliminated, by raising the second bend portion BE2 in an upward direction, compared to the semiconductor device 100 illustrated in FIG. 2A and FIG. 2B, to increase a width of the opening SP.

Figure 5:
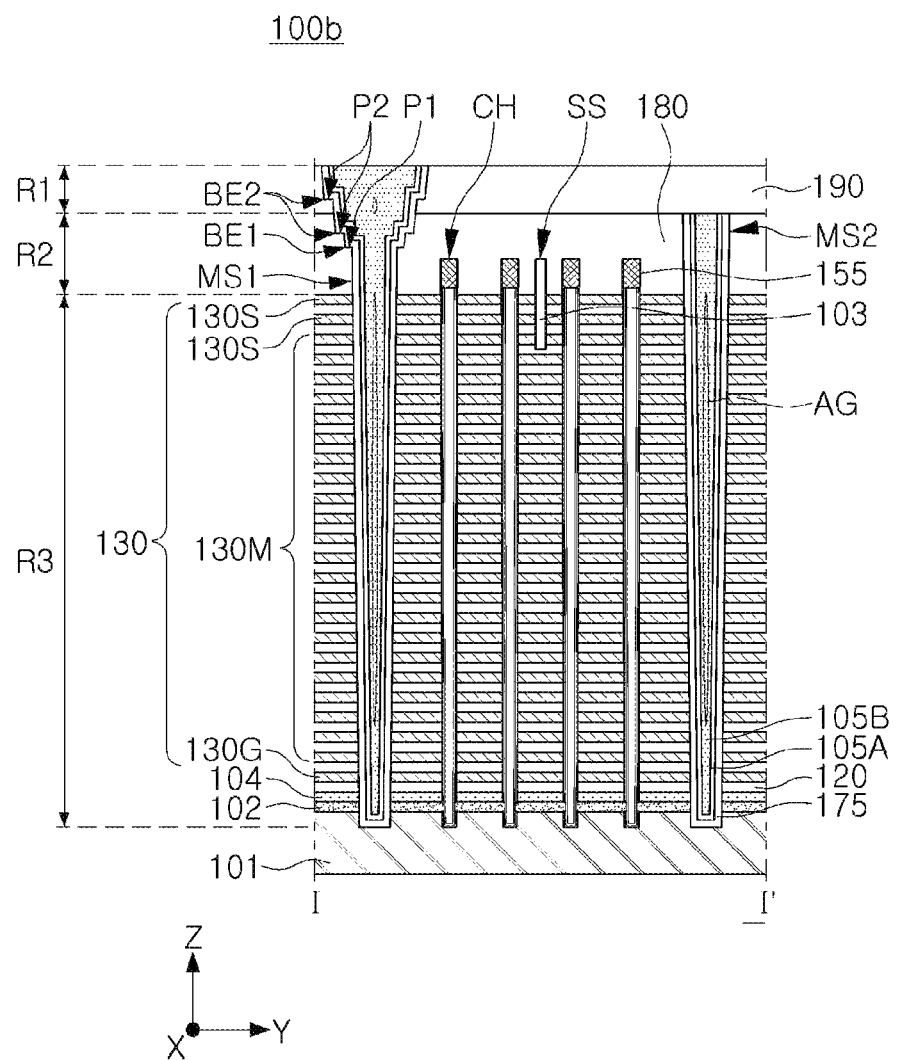
FIG. 5 is a schematic cross-sectional view of a semiconductor device according to example embodiments of the present inventive concept.

FIG. 5 is a schematic cross-sectional view of a semiconductor device according to example embodiments of the present inventive concept.

Referring to FIG. 5, a semiconductor device 100b may further include an additional bend portion, unlike in the embodiment of FIGS. 1A to 3. For example, the number of second bend portions BE2 may be provided as a plurality of second bend portions BE2. Therefore, a first one of the second bend portions BE2 may be disposed in a first region R1, and a second one of the second bend portions BE2 may be disposed in a second region R2. Therefore, as in the embodiments of FIGS. 2A and 4, a lower air-gap AG may decrease, and an upper air-gap AG may decrease at the same time. Also, in some example embodiments, all of the second bend portions BE2 may be disposed in the first region R1 or in the second region R2.

Figure 6:
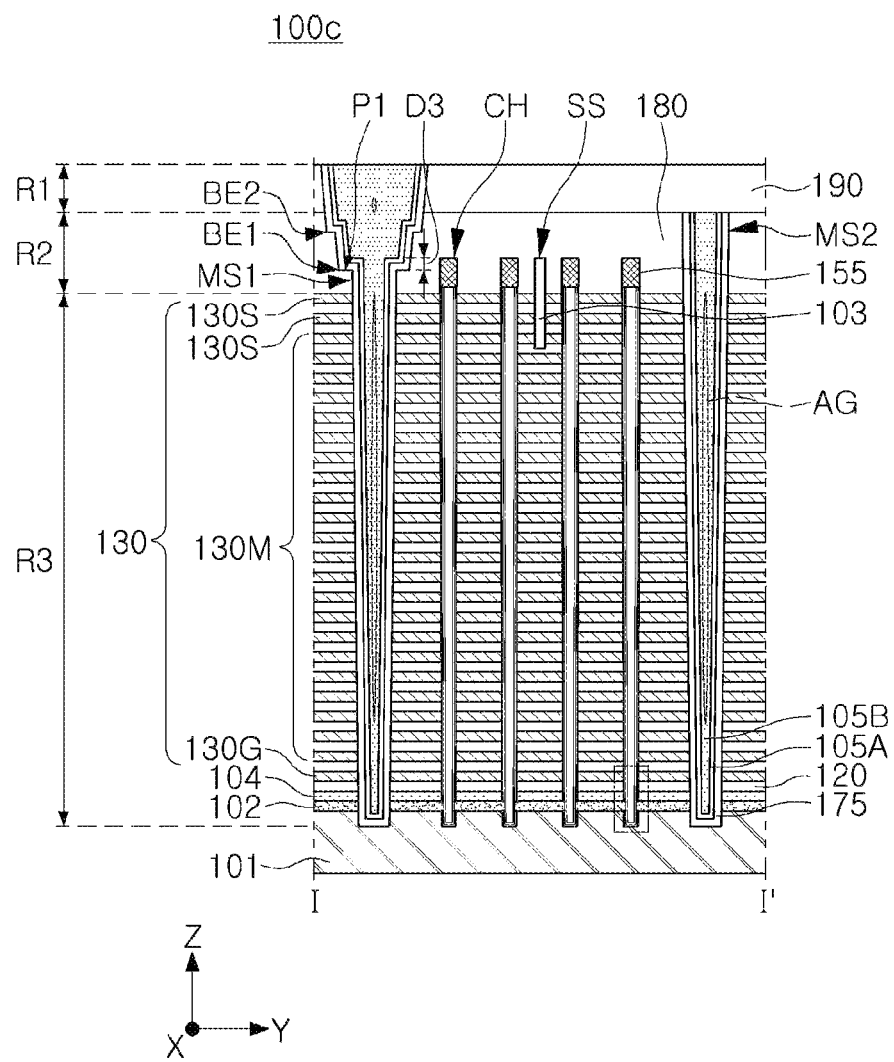
FIG. 6 is a schematic cross-sectional view of a semiconductor device according to example embodiments of the present inventive concept.

FIG. 6 is a schematic cross-sectional view of a semiconductor device according to example embodiments of the present inventive concept.

Referring to FIG. 6, in a semiconductor device 100c, a first surface P1 of a first bend portion BE1 may be disposed on a height level, lower than height levels of upper surfaces of the channel structures CH by a third dimension D3. Therefore, ability to reduce an air-gap AG may be improved by forming the first bend portion BE1 as close as possible to an upper surface of a third region R3 having a low aspect ratio to increase a width of an opening.

Figure 7:
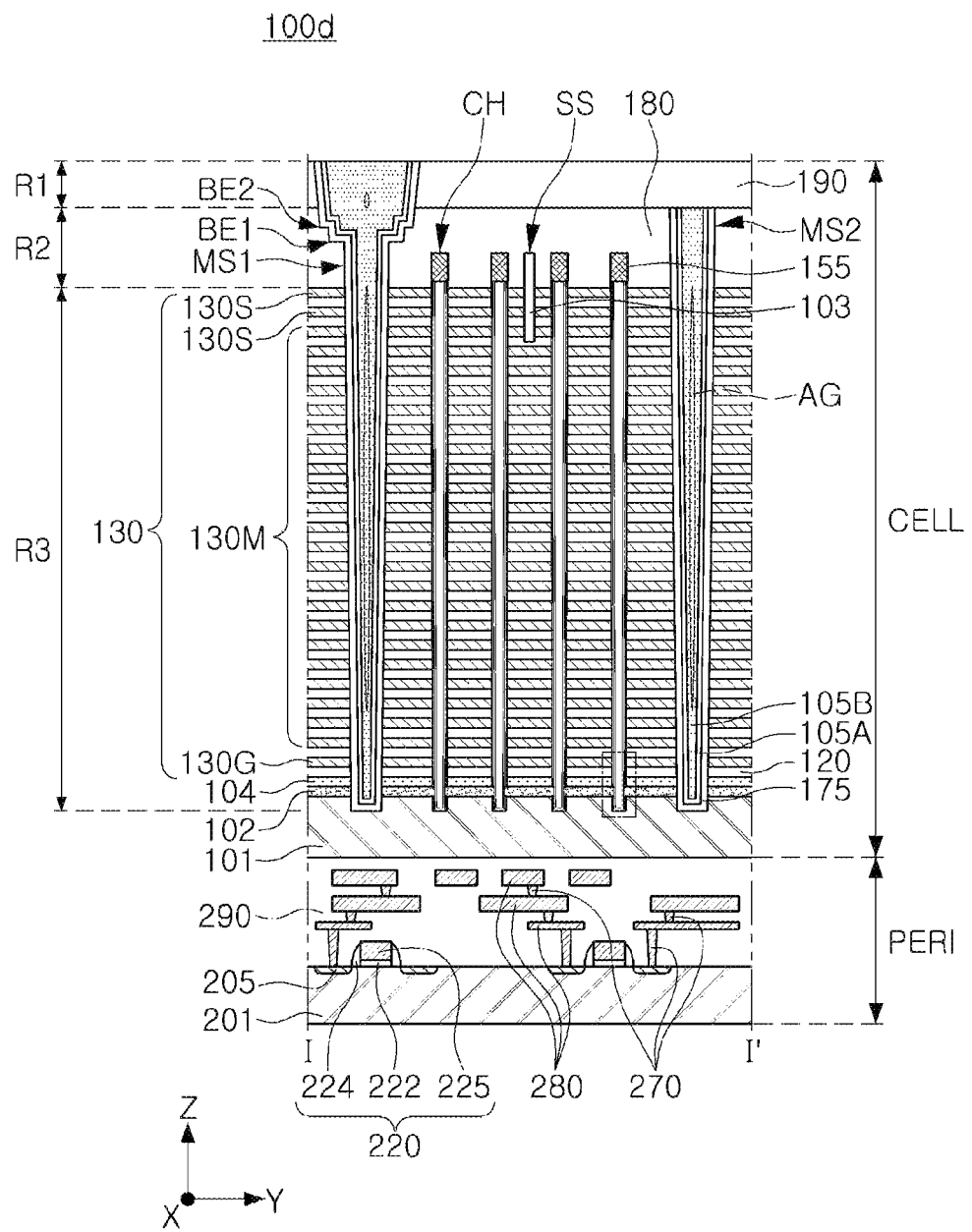
FIG. 7 is a schematic cross-sectional view of a semiconductor device according to example embodiments of the present inventive concept.

FIG. 7 is a schematic cross-sectional view of a semiconductor device according to example embodiments of the present inventive concept.

Referring to FIG. 7, a semiconductor device 100d may include a memory cell region CELL and a peripheral circuit region PERI, stacked vertically. The memory cell region CELL may be disposed on the peripheral circuit region PERI. For example, in the semiconductor device 100 of FIG. 2A, a peripheral circuit region PERI may be disposed on the substrate 101 in a region not illustrated, or a peripheral circuit region PERI may be disposed in a lower portion as in the semiconductor device 100d. In example embodiments, the memory cell region CELL may be disposed below the peripheral circuit region PERI. For description of the memory cell region CELL, the same description with reference to FIGS. 1A to 3 may be applied.

The peripheral circuit region PERI may include a base substrate 201, and circuit elements 220, circuit contact plugs 270, and circuit wiring lines 280, disposed on the base substrate 201.

The base substrate 201 may have an upper surface extending in the X and Y directions. The upper surface of the base substrate 201 may be parallel to the X and Y directions. In the base substrate 201, separate device separation layers may be formed to define an active region. Source/drain regions 205 including impurities may be disposed in a portion of the active region. The base substrate 201 may include a semiconductor material, for example, a group IV semiconductor, a group III-V compound semiconductor, or a group II-VI compound semiconductor. The base substrate 201 may be provided as a bulk wafer or an epitaxial layer. In this embodiment, a substrate 101 in an upper portion may be provided as a polycrystalline semiconductor layer such as a polycrystalline silicon layer, or an epitaxial layer.

The circuit elements 220 may include horizontal transistors. Each of the circuit elements 220 may include a circuit gate dielectric layer 222, a spacer layer 224, and a circuit gate electrode 225. Source/drain regions 205 may be disposed in the base substrate 201 on both sides of the circuit gate electrode 225.

A peripheral region insulating layer 290 may be disposed on the circuit elements 220 on the base substrate 201. The circuit contact plugs 270 may pass through the peripheral region insulating layer 290, to be connected to the source/drain regions 205. Electrical signals may be applied to the circuit elements 220 by the circuit contact plugs 270. In a region not illustrated, the circuit contact plugs 270 may also be connected to the circuit gate electrode 225. The circuit wiring lines 280 may be connected to the circuit contact plugs 270 and may be arranged as a plurality of layers.

In the semiconductor device 100d, the peripheral circuit region PERI may be first manufactured, and the substrate 101 of the memory cell region CELL may be then formed thereon, to manufacture the memory cell region CELL. The substrate 101 may have the same size as the base substrate 201 or may be formed to have a size smaller than the base substrate 201. The memory cell region CELL and the peripheral circuit area PERI may be connected to each other in a region not illustrated. For example, one end of the gate electrode layers 130 in the Z direction may be electrically connected to the circuit elements 220. A configuration in which the memory cell region CELL and the peripheral circuit region PERI are vertically stacked may also be applied to the embodiments of FIGS. 1A to 6.

Figure 8:
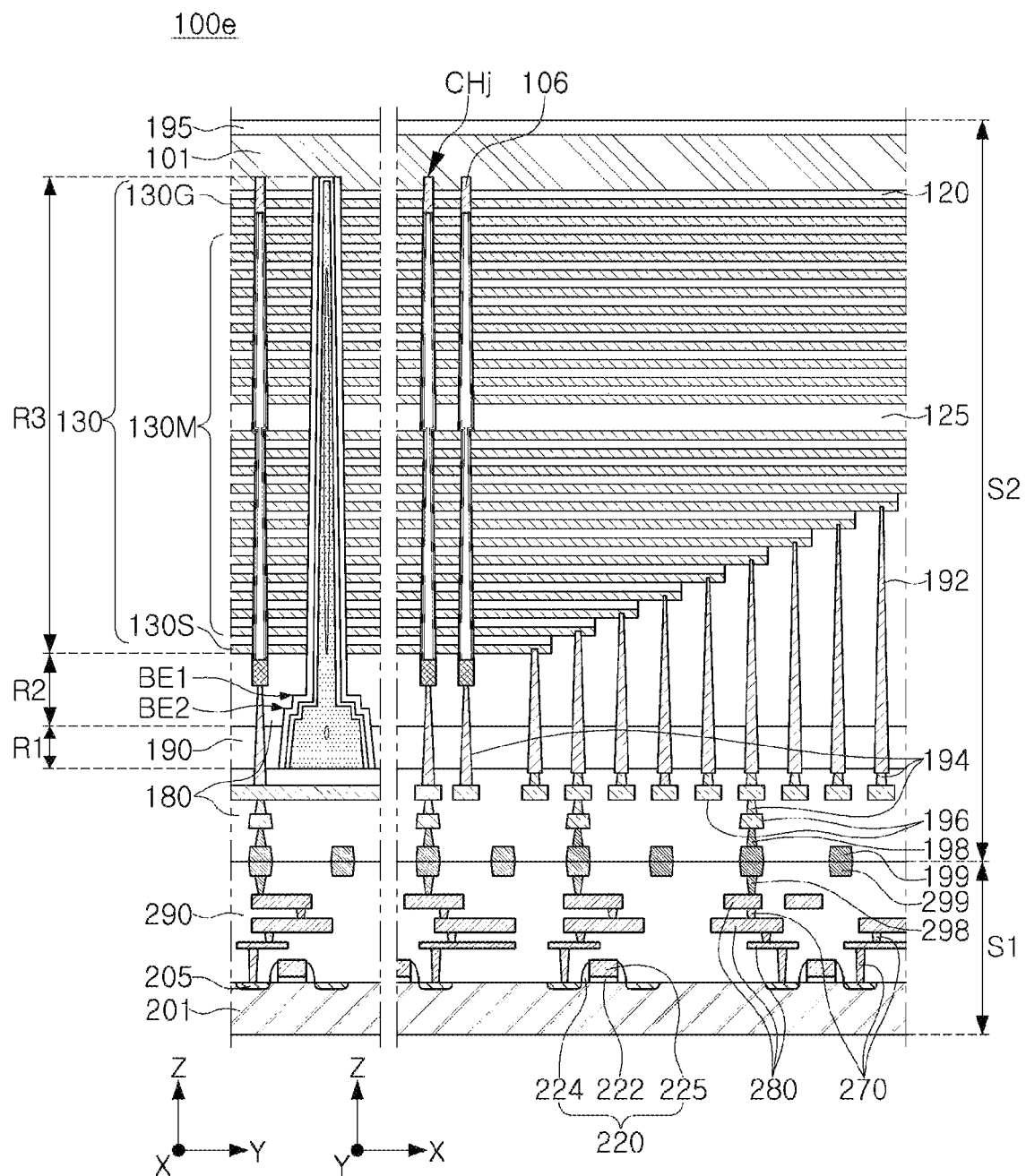
FIG. 8 is a schematic cross-sectional view of a semiconductor device according to example embodiments of the present inventive concept.

FIG. 8 is a schematic cross-sectional view of a semiconductor device according to example embodiments of the present inventive concept.

Referring to FIG. 8, a semiconductor device 100e may include a first structure S1 and a second structure S2, bonded by a wafer bonding method.

The description of the peripheral circuit region PERI described above with reference to FIG. 7 may be applied to the first structure S1. The first structure S1 may further include first bonding vias 298 and first bonding pads 299, which may be bonding structures. The first bonding vias 298 may be disposed on an uppermost circuit wiring line, among circuit wiring lines 280, to be connected to the circuit wiring lines 280. At least a portion of the first bonding pads 299 may be provided on the first bonding vias 298 and may be connected to the first bonding vias 298. The first bonding pads 299 may be connected to second bonding pads 199 of the second structure S2. The first bonding pads 299 may provide an electrical connection path, according to bonding of the first structure S1 and the second structure S2, together with the second bonding pads 199. The first bonding vias 298 and the first bonding pads 299 may include a conductive material, for example, copper (Cu).

For the second structure S2, the descriptions with reference to FIGS. 1A to 6 may be equally applied, unless otherwise specified. The second structure S2 may further include first cell contact plugs 192, second cell contact plugs 194, and cell wiring lines 196, which may be wiring structures, and may further include second bonding vias 198 and second bonding pads 199, which may be bonding structures. The second structure S2 may further include a protective layer 195 covering an upper surface of a substrate 101. In addition, the second structure S2 may not include first and second horizontal conductive layers 102 and 104 (see FIG. 2A), and channel structures CHj may further include an epitaxial layer 106.

The first cell contact plugs 192 may pass through a cell region insulating layer 180 and an upper support layer 190 to be connected to gate electrode layers 130. The second cell contact plugs 194 may be disposed below the first cell contact plugs 192 and the channel structures CHj and may connect the first cell contact plugs 192 and channel structures CHj and the cell wiring lines 196 or connect the cell wiring lines 196 to each other. In some embodiments, numbers and arrangements of contact plugs and wiring lines constituting a wiring structure may be variously changed. The first cell contact plugs 192, the second cell contact plugs 194, and the cell wiring lines 196 may be formed of a conductive material, for example, at least one of tungsten (W), aluminum (Al), or copper (Cu).

The second bonding vias 198 and the second bonding pads 199 may be arranged below a lowermost cell wiring line among the cell wiring lines 196. The second bonding vias 198 may be connected to the cell wiring lines 196 and the second bonding pads 199, and the second bonding pads 199 may be bonded to the first bonding pads 299 of the first structure S1. The second bonding vias 198 and the second bonding pads 199 may include a conductive material, for example, copper (Cu).

The epitaxial layer 106 may be disposed on the substrate 101 on an upper end of the channel structure CHj and may be disposed on side surfaces of at least one gate electrode layer among the gate electrode layers 130. The epitaxial layer 106 may be disposed in a recessed region of the substrate 101. A lower surface of the epitaxial layer 106 may be lower than a lower surface of an uppermost gate electrode layer 130, among the gate electrode layers 130, and may be higher than an upper surface of a gate electrode layer 130, below the uppermost gate electrode layer, in FIG. 8, but is not limited thereto. The epitaxial layer 106 may be connected to a channel layer 140 through a lower surface thereof. The epitaxial layer 106 may be formed of a semiconductor material. A gate insulating layer may be further disposed between the epitaxial layer 106 and the gate electrode layers 130 contacting the epitaxial layer 106. Such a shape of the channel structure CHj may be applied to the embodiments of FIGS. 1A to 7.

The first structure S1 and the second structure S2 may be bonded using the first bonding pads 299 and the second bonding pads 199 by, for example, copper (Cu)-copper (Cu) bonding. In addition to the copper (Cu)-copper (Cu) bonding, the first structure S1 and the second structure S2 may be additionally bonded by, for example, dielectric-dielectric bonding. The dielectric-dielectric bonding may be a bonding by a dielectric layer respectively forming a portion of a peripheral region insulating layer 290 and a portion of the cell region insulating layer 180, and respectively enclosing the first bonding pads 299 and the second bonding pads 199. Therefore, the first structure S1 and the second structure S2 may be bonded without a separate adhesive layer.

FIGS. 9A to 9J are schematic cross-sectional views illustrating a method of manufacturing a semiconductor device according to example embodiments of the present inventive concept. In FIGS. 9A to 9J, components corresponding to the components illustrated in FIG. 2A are illustrated.

Figure 9A:
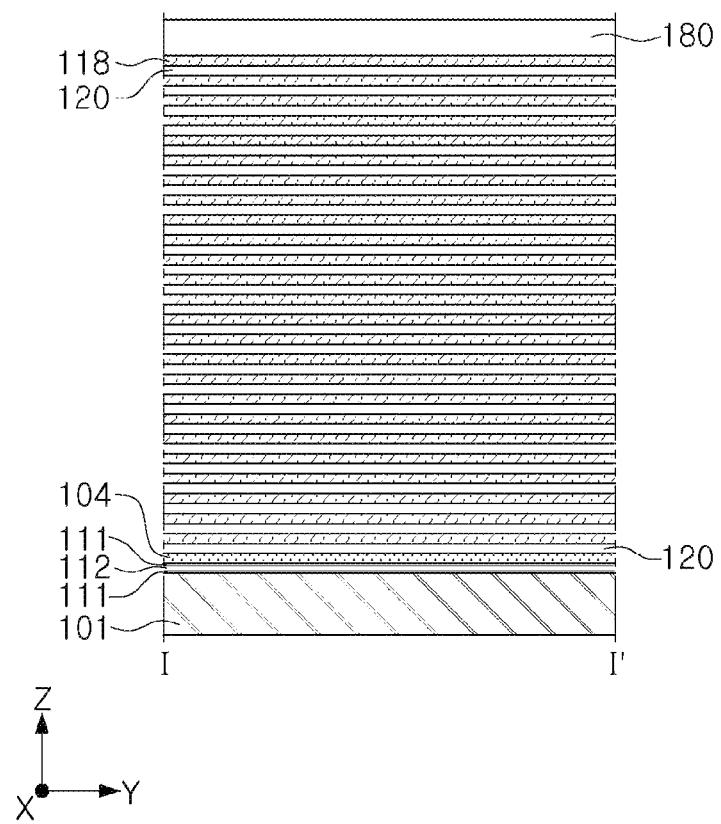
FIGS. 9A, 9B, 9C, 9D, 9E, 9F, 9G, 9H, 9I and 9J are schematic cross-sectional views illustrating methods of manufacturing a semiconductor device according to example embodiments of the present inventive concept.

Referring to FIG. 9A, first and second horizontal sacrificial layers 111 and 112 and a second horizontal conductive layer 104 may be formed on a substrate 101, and sacrificial insulating layers 118 and an interlayer insulating layer 120 may be alternately stacked.

The first and second horizontal sacrificial layers 111 and 112 may be stacked on the substrate 101, such that the first horizontal sacrificial layers 111 are disposed above and below the second horizontal sacrificial layer 112. The first and second horizontal sacrificial layers 111 and 112 may include different materials. The first and second horizontal sacrificial layers 111 and 112 may be layers that are replaced with a first horizontal conductive layer 102 (refer to FIG. 2A) by a subsequent process. For example, the first horizontal sacrificial layers 111 may be formed of the same material as the interlayer insulating layers 120, and the second horizontal sacrificial layer 112 may be formed of the same material as a sacrificial insulating layer 118. The second horizontal conductive layer 104 may be formed on the first and second horizontal sacrificial layers 111 and 112.

The sacrificial insulating layers 118 may be partially replaced by gate electrode layers 130 (see FIG. 2A) by a subsequent process. The sacrificial insulating layers 118 may be formed of a material different from that of the interlayer insulating layers 120 and may be formed of a material that may be selectively etched with respect to the interlayer insulating layers 120 under specific etching conditions. For example, the interlayer insulating layers 120 may be formed of at least one of silicon oxide or silicon nitride, and the sacrificial insulating layers 118 may be formed of a material selected from silicon, silicon oxide, silicon carbide, and silicon nitride, and different from the interlayer insulating layers 120. In some embodiments, thicknesses of the interlayer insulating layers 120 may not all be the same. A thickness of each of the interlayer insulating layers 120, a thickness of each of the sacrificial insulating layers 118, and the number of layers constituting each of them may be variously changed, from those illustrated.

Next, a cell region insulating layer 180 covering a stack structure formed of the sacrificial insulating layers 118 and the interlayer insulating layers 120 may be partially formed.

Figure 9B:
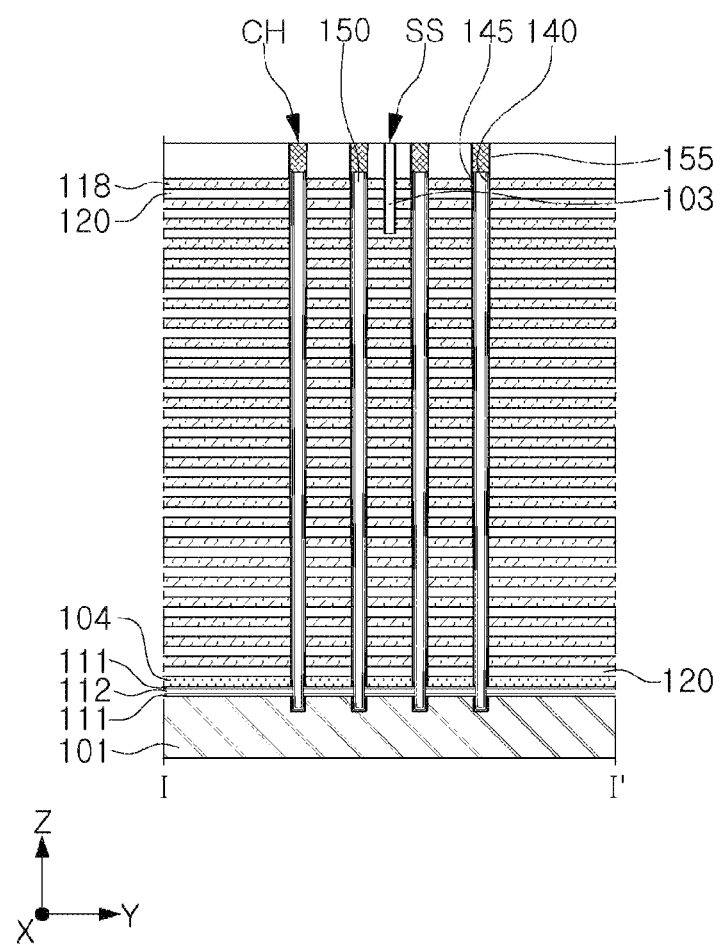

Referring to FIG. 9B, channel structures CH passing through the stack structure formed of the sacrificial insulating layers 118 and the interlayer insulating layers 120 may be formed.

First, portions of the sacrificial insulating layers 118 and portions of the interlayer insulating layers 120 may be removed to form upper separation regions SS. Regions in which the upper separation regions SS are formed may be exposed using a separate mask layer, a predetermined number of sacrificial insulating layers 118 and a predetermined number of interlayer insulating layers 120 may be removed from the top, and an insulating material may be then deposited to form an upper separation insulating layer 103.

The channel structures CH may be formed by forming channel holes having a hole shape by anisotropically etching the sacrificial insulating layers 118 and the interlayer insulating layers 120 using a mask layer, and then burying the channel holes. Due to a height of the stack structure, sidewalls of each of the channel structures CH may not be perpendicular to an upper surface of the substrate 101. The channel structures CH may be formed to recess a portion of the substrate 101. Next, at least a portion of a gate dielectric layer 145, a channel layer 140, a buried channel insulating layer 150, and channel pads 155 may be sequentially formed in each of the channel structures CH.

The gate dielectric layer 145 may be formed to have a uniform thickness using an ALD and/or CVD process. In this operation, all or portion of the gate dielectric layer 145 may be formed, and a portion of the gate dielectric layer 145 extending perpendicularly to the substrate 101 along each of the channel structures CH may be formed in this operation. The channel layer 140 may be formed on the gate dielectric layer 145 in each of the channel structures CH. The buried channel insulating layer 150 may be formed to fill the channel structures CH and may be an insulating material. The channel pads 155 may be formed of a conductive material, and may be formed of, for example, polycrystalline silicon.

Figure 9C:
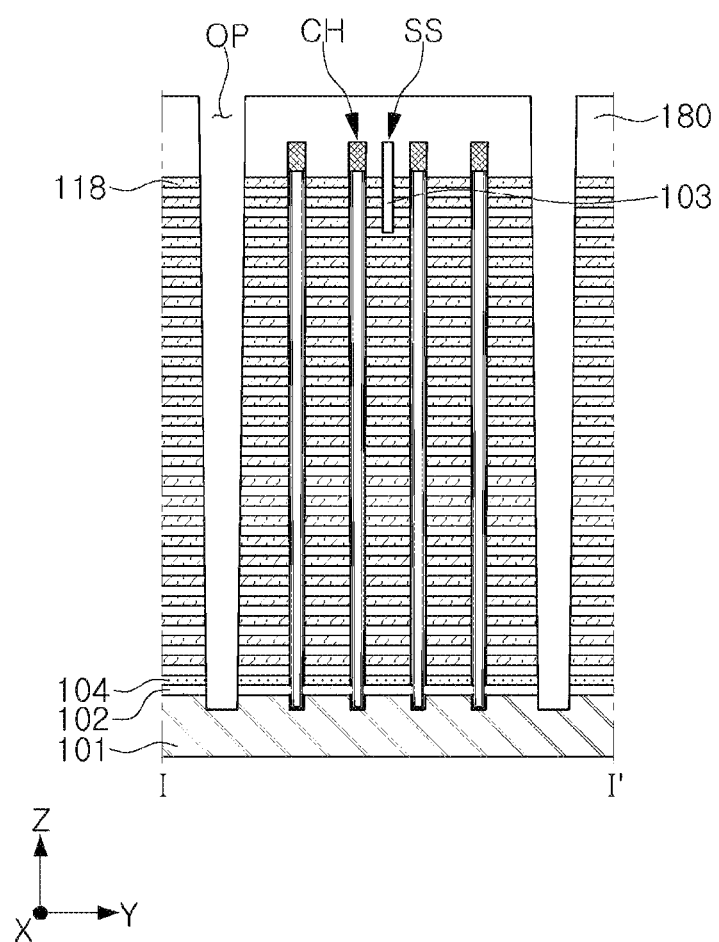

Referring to FIG. 9C, in regions corresponding to separation regions MS1 and MS2 (see FIG. 2A), trenches OP passing through the stack structure formed of the sacrificial insulating layers 118 and the interlayer insulating layers 120 may be formed, and a first horizontal conductive layer 102 may be formed.

First, a cell region insulating layer 180 may be additionally formed on the channel structures CH and trenches OP may be formed. The trenches OP may be formed to pass through the stack structure formed of the sacrificial insulating layers 118 and the interlayer insulating layers 120 and extend in the X direction through the second horizontal conductive layer 104 from the bottom. Next, the second horizontal sacrificial layer 112 may be exposed by an etch-back process while forming separate sacrificial spacer layers in the trenches OP. The exposed second horizontal sacrificial layer 112 may be selectively removed, and then the first horizontal sacrificial layers 111 above and below the exposed second horizontal sacrificial layer 112 may be removed.

The first and second horizontal sacrificial layers 111 and 112 may be removed by, for example, a wet etching process. In the operation of removing the first and second horizontal sacrificial layers 111 and 112, a portion of the gate dielectric layer 145 exposed in a region from which the second horizontal sacrificial layer 112 is removed may also be removed. A conductive material may be deposited, in regions from which the first and second horizontal sacrificial layers 111 and 112 are removed, to form a first horizontal conductive layer 102, and the sacrificial spacer layers may be removed from the trenches OP.

Figure 9D:
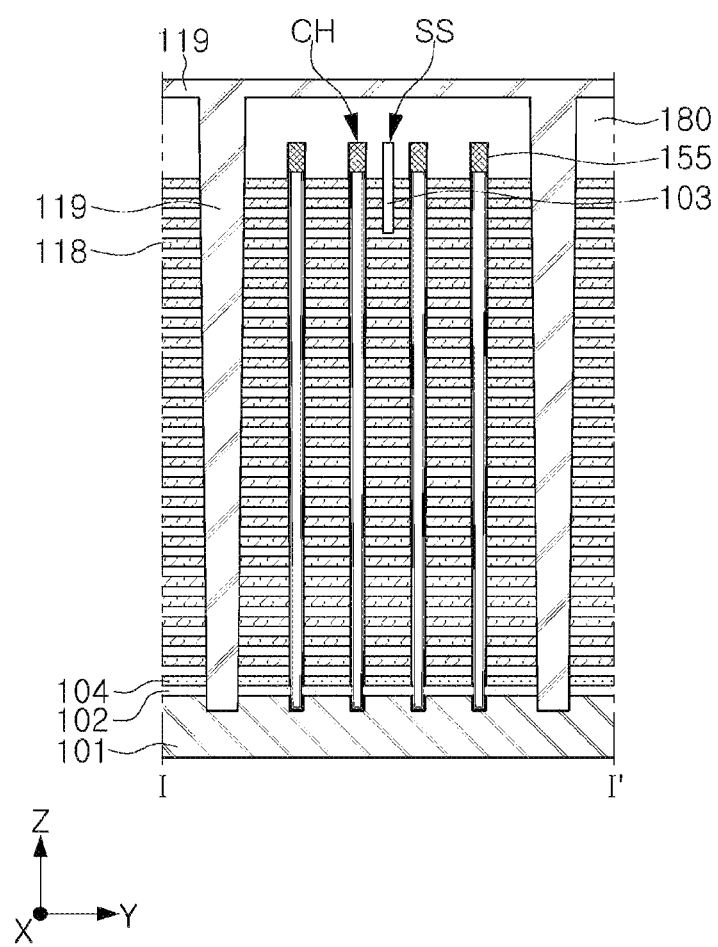

Referring to FIG. 9D, a vertical sacrificial layer 119 filling the trenches OP may be formed.

The vertical sacrificial layer 119 may be formed to fill the trenches OP. The vertical sacrificial layer 119 may be provided as a single layer or a plurality of layers. For example, the vertical sacrificial layer 119 may include two layers of silicon nitride/polycrystalline silicon.

Figure 9E:
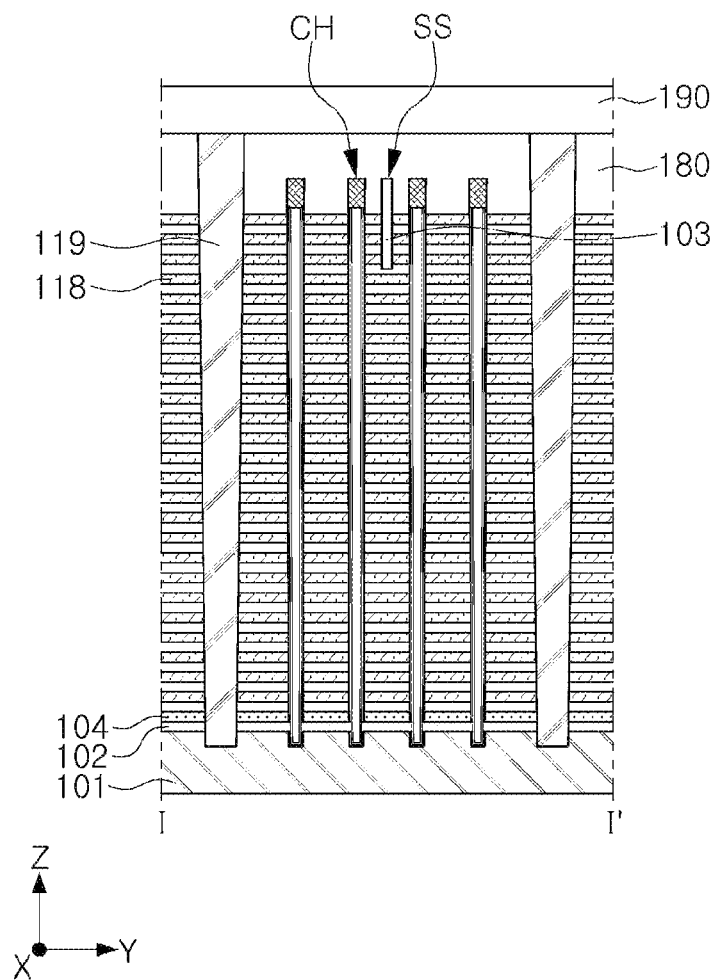

Referring to FIG. 9E, an upper support layer 190 may be formed on the cell region insulating layer 180.

First, a portion of the vertical sacrificial layer 119 on the cell region insulating layer 180 may be removed by a planarization process, to remain only a portion of the vertical sacrificial layer 119 in the trenches OP. Next, an upper support layer 190 may be formed on, the vertical sacrificial layer 119 and the cell region insulating layer 180. The upper support layer 190 may be a layer for supporting a stack structure formed of the interlayer insulating layers 120 during subsequent removal of the sacrificial insulating layers 118.

Figure 9F:
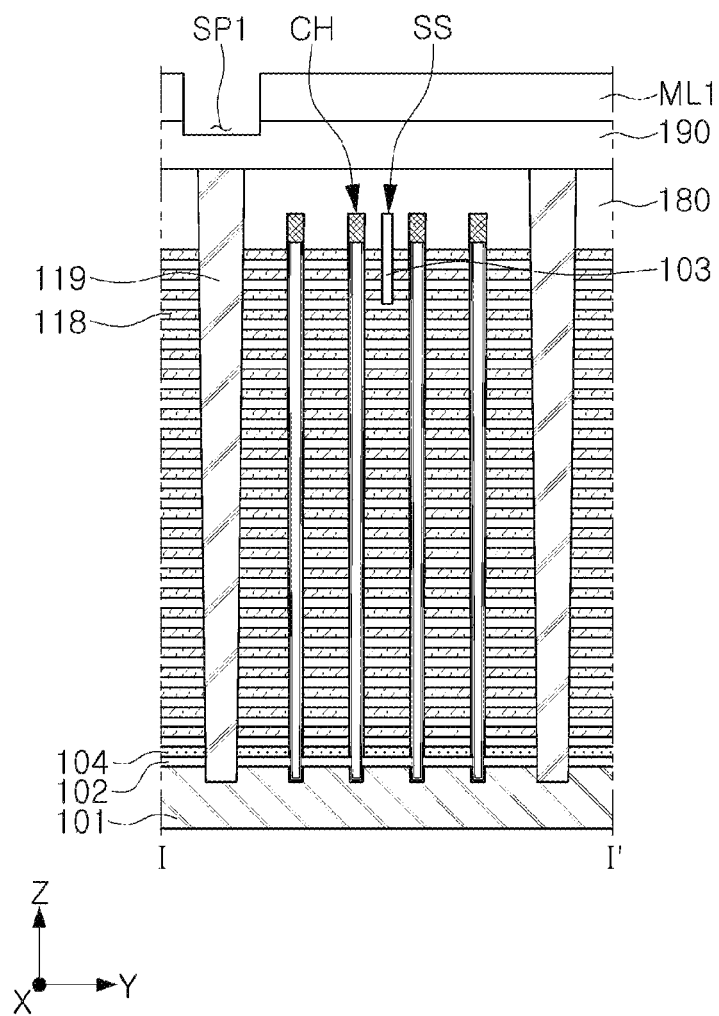

Referring to FIG. 9F, openings SP1 may be formed by removing a portion of the upper support layer 190.

The openings SP1 may be formed by an etching process using a first photomask layer ML1. The openings formed using the first photomask layer ML1 may be referred to as first openings SP1. The first openings SP1 (e.g., the entirety of the first openings SP1) may be higher than a lower surface of the upper support layer 190. In some embodiments, the first openings SP1 may be formed to a depth level, lower than the lower surface of the upper support layer 190. In this case, the vertical sacrificial layer 119 may be formed to be exposed in some regions along the vertical sacrificial layer 119 extending in a linear shape. Also, in some embodiments, the first openings SP1 may be formed to have substantially the same depth level as the lower surface of the upper support layer 190.

Figure 9G:
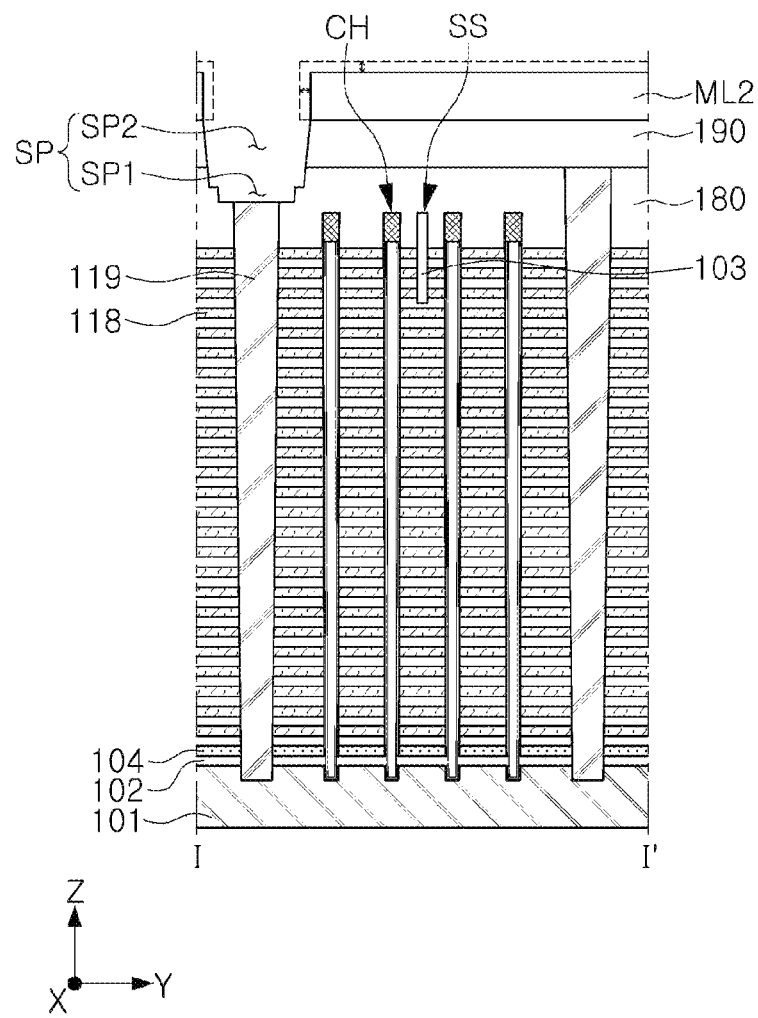

Referring to FIG. 9G, openings SP may be formed by forming an upper portion thereof wider and deeper, by an etching process using a second photomask layer ML2 formed by reducing a size of the first photomask layer ML1 by the same widths in the X, Y, and Z directions.

The second photomask layer ML2 may be reduced to the same width from the first photomask layer ML1 by a trimming process, to expose the upper support layer 190. Therefore, height levels and areas of left and right steps, based on the Z direction as an axis, may be formed to be equal to each other in the X and Y directions. In addition, by this etching process, as illustrated in FIG. 2A, a first surface P1 and a second surface P2 of the first separation region MS1 around the Z direction as an axis may have constant widths. In some embodiments, the structure of FIG. 9G may be formed by a multi-etch process using separate photomasks. Also in this case, distances to an end of a surface in the Y direction may be constant based on the Z direction axis. The openings SP formed using the second photomask layer ML2 may be referred to as second openings SP2. Each of the openings SP may include a first opening SP1 and a second opening SP2.

Figure 9H:
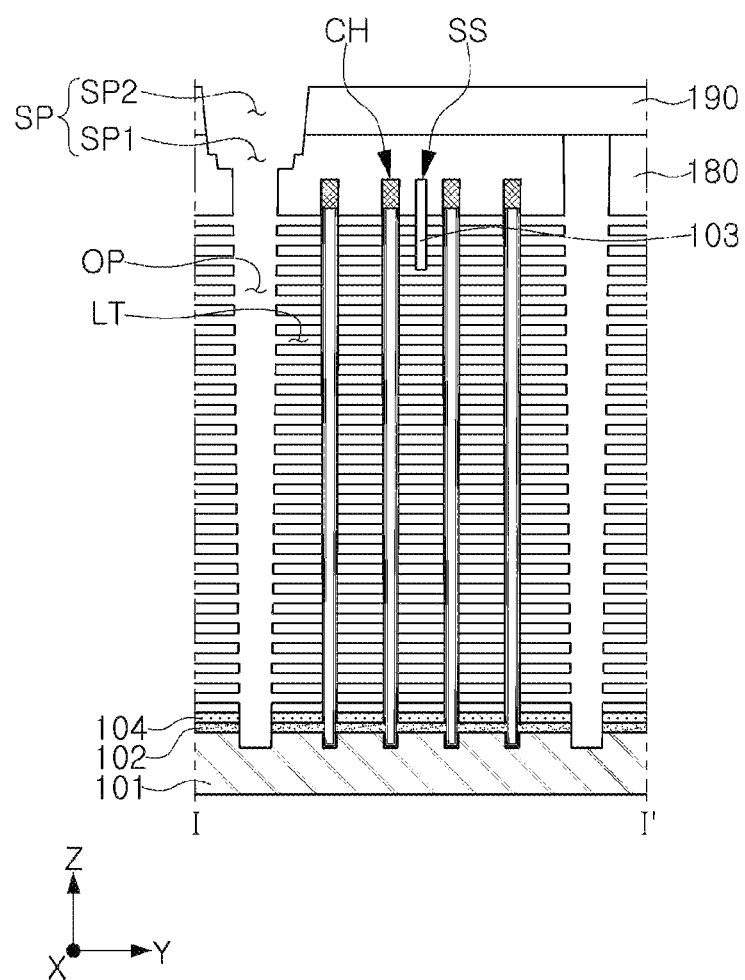

Referring to FIG. 9H, the vertical sacrificial layer 119 may be removed through the openings SP to form trenches OP again, and the sacrificial insulating layers 118 may be removed through the trenches OP to form tunnel portions LT.

First, the vertical sacrificial layer 119 may be selectively removed through the openings SP to form trenches OP. Next, the sacrificial insulating layers 118 may be selectively removed through the trenches OP. The vertical sacrificial layer 119 and the sacrificial insulating layers 118 may be selectively removed with respect to the interlayer insulating layers 120 using, for example, wet etching. Therefore, a plurality of tunnel portions LT may be formed between the interlayer insulating layers 120.

Figure 9I:
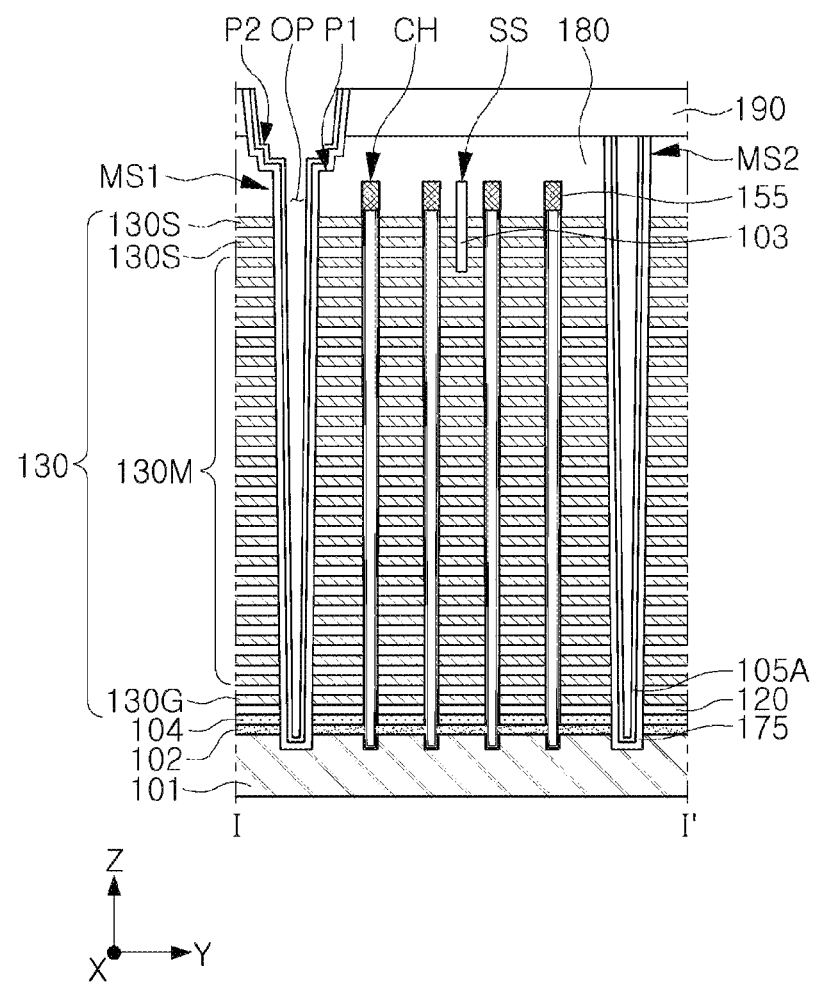

Referring to FIG. 9I, the tunnel portions LT from which the sacrificial insulating layers 118 are partially removed may be buried with a conductive material to form gate electrode layers 130, and a metal oxide layer 175 and a first separation insulating layer 105A may be then formed.

The conductive material forming the gate electrode layers 130 may fill the tunnel portions LT. The conductive material may include a metal, polycrystalline silicon and/or a metal silicide material. After forming the gate electrode layers 130, the conductive material deposited in the trenches OP may be removed by an additional process, and the metal oxide layer 175 and the first separation insulating layer 105A may be formed. When the conductive material is removed, the gate electrode layers 130 may be partially removed from the trenches OP. The metal oxide layer 175 may include, for example, a metal oxide such as aluminum oxide. The first separation insulating layer 105A may include an insulating material, for example, at least one of silicon oxide, silicon nitride, or silicon oxynitride.

The metal oxide layer 175 may be formed to have a relatively thin thickness, to cover inner side walls and bottom surfaces of the trenches OP. Thereafter, the first separation insulating layer 105A may be formed to cover inner side walls and a bottom surface of the metal oxide layer 175. Therefore, each of the first and second separation regions MS1 and MS2 may include a metal oxide layer 175 covering side surfaces and bottom surfaces of the separation regions MS1 and MS2, and a first separation insulating layer 105A disposed on the metal oxide layer 175.

Figure 9J:
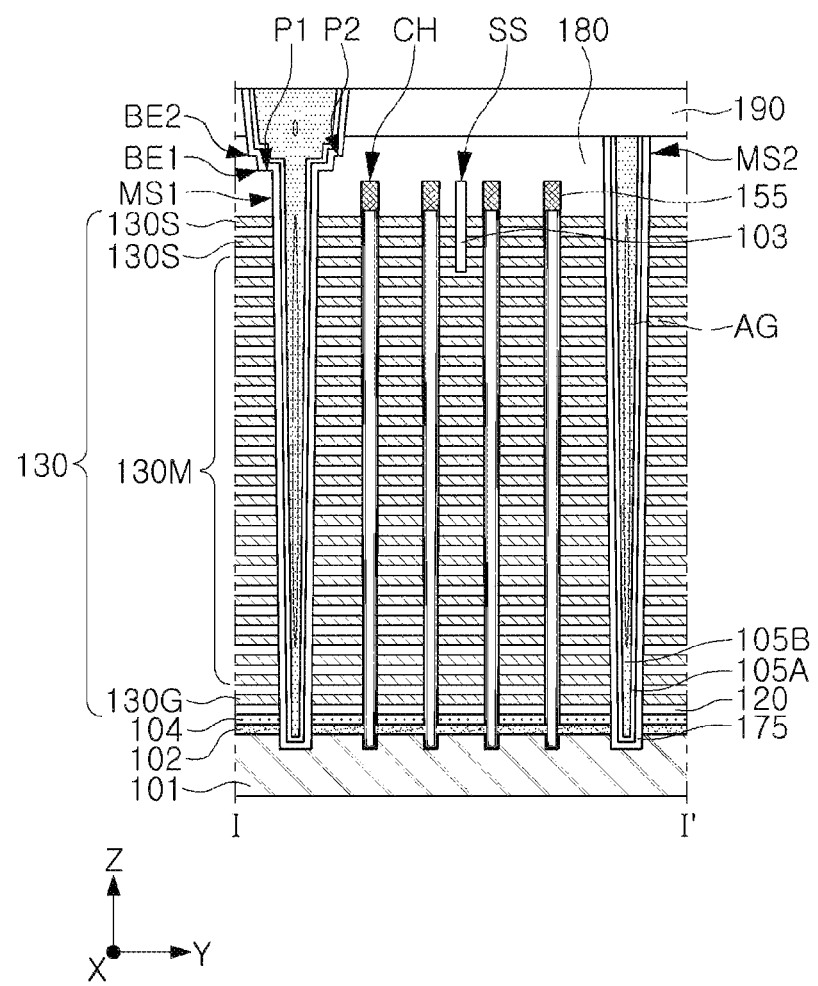

Referring to FIG. 9J, a second separation insulating layer 105B may be additionally formed in the first and second separation regions MS1 and MS2. The second separation insulating layer 105B may be stacked on the first separation insulating layer 105A. The second separation insulating layer 105B may be formed to fill the first and second separation regions MS1 and MS2. The second separation insulating layer 105B may be formed while filling upper portions of the first separation regions MS1 during an operation thereof and may be in contact with an upper surface of the upper support layer 190. The structure as illustrated in FIG. 9J may be prepared by removing the second separation insulating layer 105B up to the upper surface of the upper support layer 190 by a planarization process.

Figure 10:
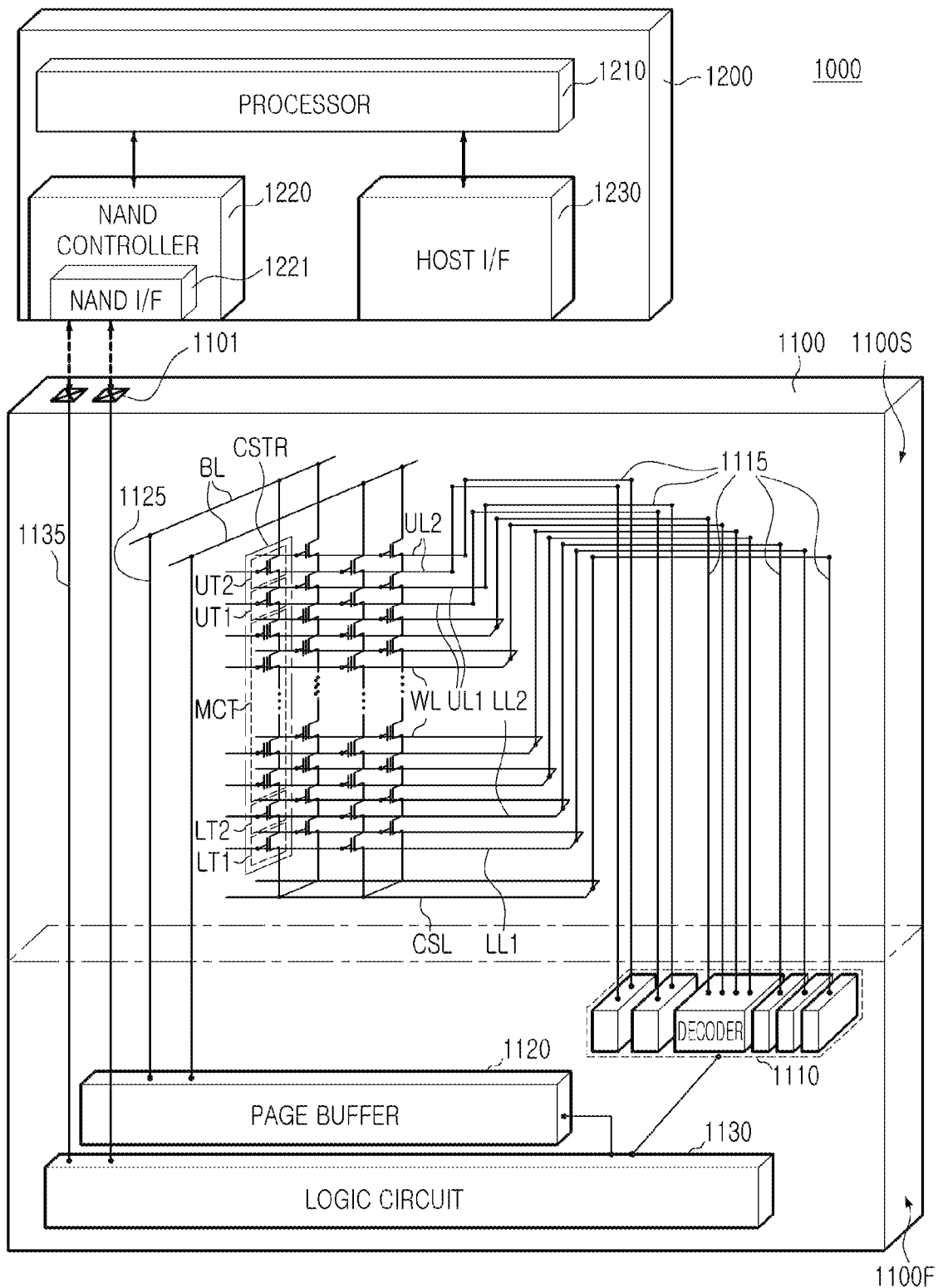
FIG. 10 is a diagram schematically illustrating a data storage system including a semiconductor device according to example embodiments of the present inventive concept.

FIG. 10 is a diagram schematically illustrating a data storage system including a semiconductor device according to example embodiments of the present inventive concept.

Referring to FIG. 10, a data storage system 1000 may include a semiconductor device 1100 and a controller 1200 electrically connected to the semiconductor device 1100. The data storage system 1000 may be a storage device including one or more semiconductor devices 1100, or an electronic device including the storage device. For example, the data storage system 1000 may be a solid state drive (SSD) device, a universal serial bus (USB), a computing system, a medical device, or a communication device, including one or more semiconductor devices 1100.

The semiconductor device 1100 may be a non-volatile memory device, for example, a NAND flash memory device described above with reference to FIGS. 1A to 8. The semiconductor device 1100 may include a first structure 1100F, and a second structure 1100S on the first structure 1100F. In example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR between each of the bit lines BL and the common source line CSL.

In the second structure 1100S, each of the memory cell strings CSTR may include lower transistors LT1 and LT2 adjacent to the common source line CSL, upper transistors UT1 and UT2 adjacent to each of the bit lines BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously changed in example embodiments.

In example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 and the upper erase control transistor UT1 may be used for an erase operation of erasing data stored in the memory cell transistors MCT using a gate-induced-drain-leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection wirings 1115 extending from the first structure 1100F into the second structure 1100S. The bit lines BL may be electrically connected to the page buffer 1120 through second connection wirings 1125 extending from the first structure 1100F into the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through input/output connection wirings 1135 extending from the first structure 1100F into the second structure 1100S.

The controller 1200 may include a processor 1210, a NAND controller 1220, and a host interface 1230. According to some embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to a predetermined firmware and may access to the semiconductor device 1100 by controlling the NAND controller 1220. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the NAND interface 1221. The host interface 1230 may provide a communication function between the data storage system 1000 and an external host. When a control command is received from the external host through the host interface 1230, the processor 1210 may control the semiconductor device 1100 in response to the control command.

Figure 11:
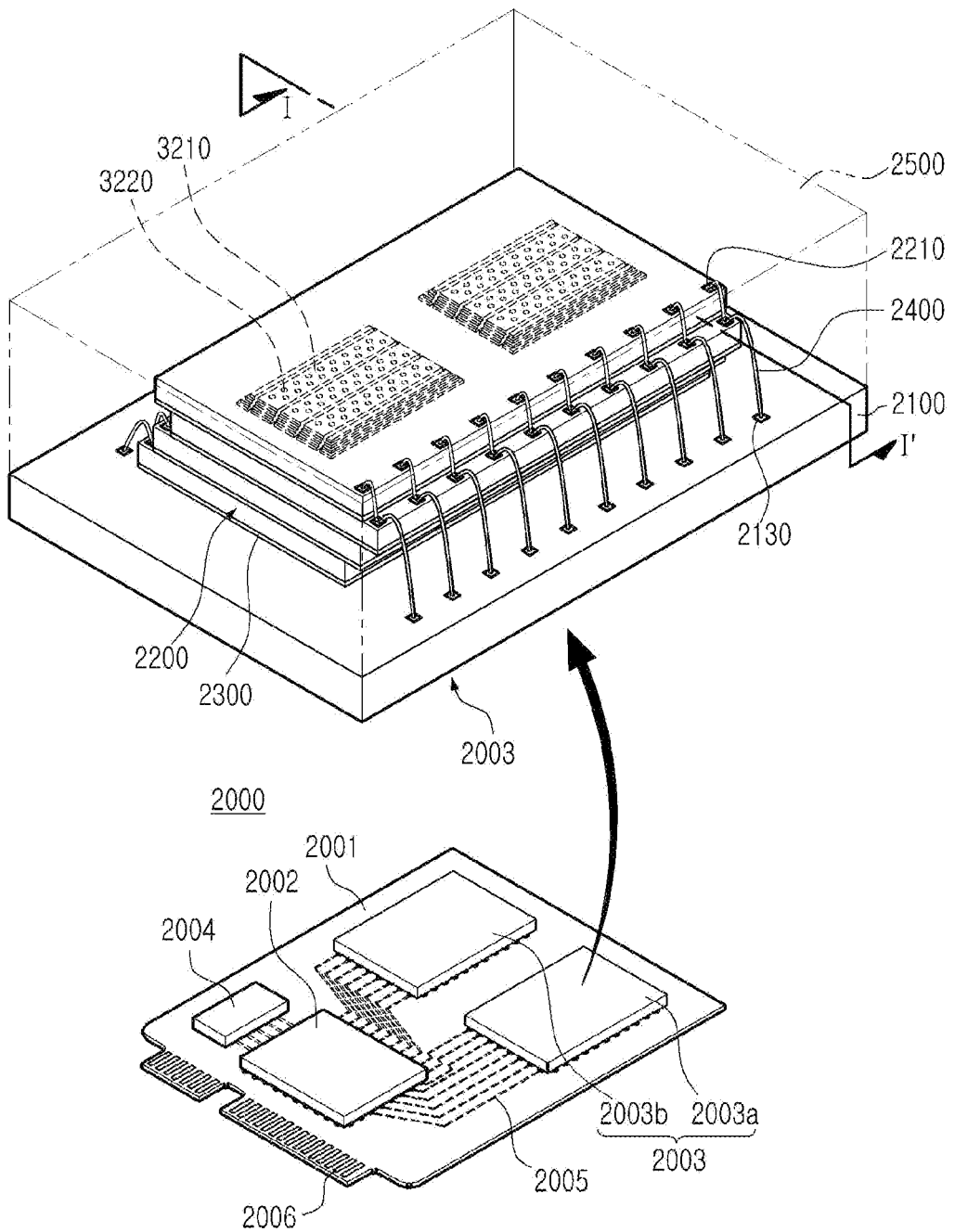
FIG. 11 is a perspective view schematically illustrating a data storage system including a semiconductor device according to example embodiments of the present inventive concept.

FIG. 11 is a perspective view schematically illustrating a data storage system including a semiconductor device according to example embodiments of the present inventive concept.

Referring to FIG. 11, a data storage system 2000 according to example embodiments of the present inventive concept may include a main substrate 2001, a controller 2002 mounted on the main substrate 2001, a semiconductor package 2003, which may be provided as one or more semiconductor packages, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins, which may be coupled to an external host. The number and arrangement of the plurality of pins in the connector 2006 may vary according to a communication interface between the data storage system 2000 and the external host. In example embodiments, the data storage system 2000 may be communicated with the external host according to any one interface of a universal serial bus (USB), peripheral component interconnection express (PCI-Express), serial advanced technology attachment (SATA), M-Phy for universal flash storage (UFS), or the like. In example embodiments, the data storage system 2000 may be operated by power supplied from the external host through the connector 2006. The data storage system 2000 may further include a power management integrated circuit (PMIC) distributing power, supplied from the external host, to the controller 2002 and the semiconductor package 2003.

The controller 2002 may write data to the semiconductor package 2003 or read data from the semiconductor package 2003 and may improve an operation speed of the data storage system 2000.

The DRAM 2004 may be a buffer memory reducing a difference in speed between the semiconductor package 2003, which may be a data storage space, and the external host. The DRAM 2004 included in the data storage system 2000 may also operate as a type of cache memory and may provide a space temporarily storing data in a control operation on the semiconductor package 2003. When the DRAM 2004 is included in the data storage system 2000, the controller 2002 may further include a DRAM controller controlling the DRAM 2004 in addition to a NAND controller controlling the semiconductor package 2003.

The semiconductor package 2003 may include first and second semiconductor packages 2003a and 2003b, spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting each of the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 10. Each of the semiconductor chips 2200 may include stack structures 3210 and memory channel structures 3220. Each of the semiconductor chips 2200 may include the semiconductor devices described above with reference to FIGS. 1A to 8.

In example embodiments, the connection structure 2400 may be a bonding wire electrically connecting the input/output pad 2210 and the upper package pads 2130. Therefore, in each of the first and second semiconductor packages 2003a and 2003b, the semiconductor chips 2200 may be electrically connected to each other by a bonding wire process, and may be electrically connected to the package upper pads 2130 of the package substrate 2100. According to some embodiments, in each of the first and second semiconductor packages 2003a and 2003b, the semiconductor chips 2200 may be electrically connected to each other by a connection structure including a through silicon via (TSV), instead of a connection structure 2400 by a bonding wire process.

In example embodiments, the controller 2002 and the semiconductor chips 2200 may be included in one (1) package. In some example embodiments, the controller 2002 and the semiconductor chips 2200 may be mounted on a separate interposer substrate, different from the main substrate 2001, and the controller 2002 and the semiconductor chips 2200 may be connected to each other by a wiring formed on the interposer substrate.

Figure 12:
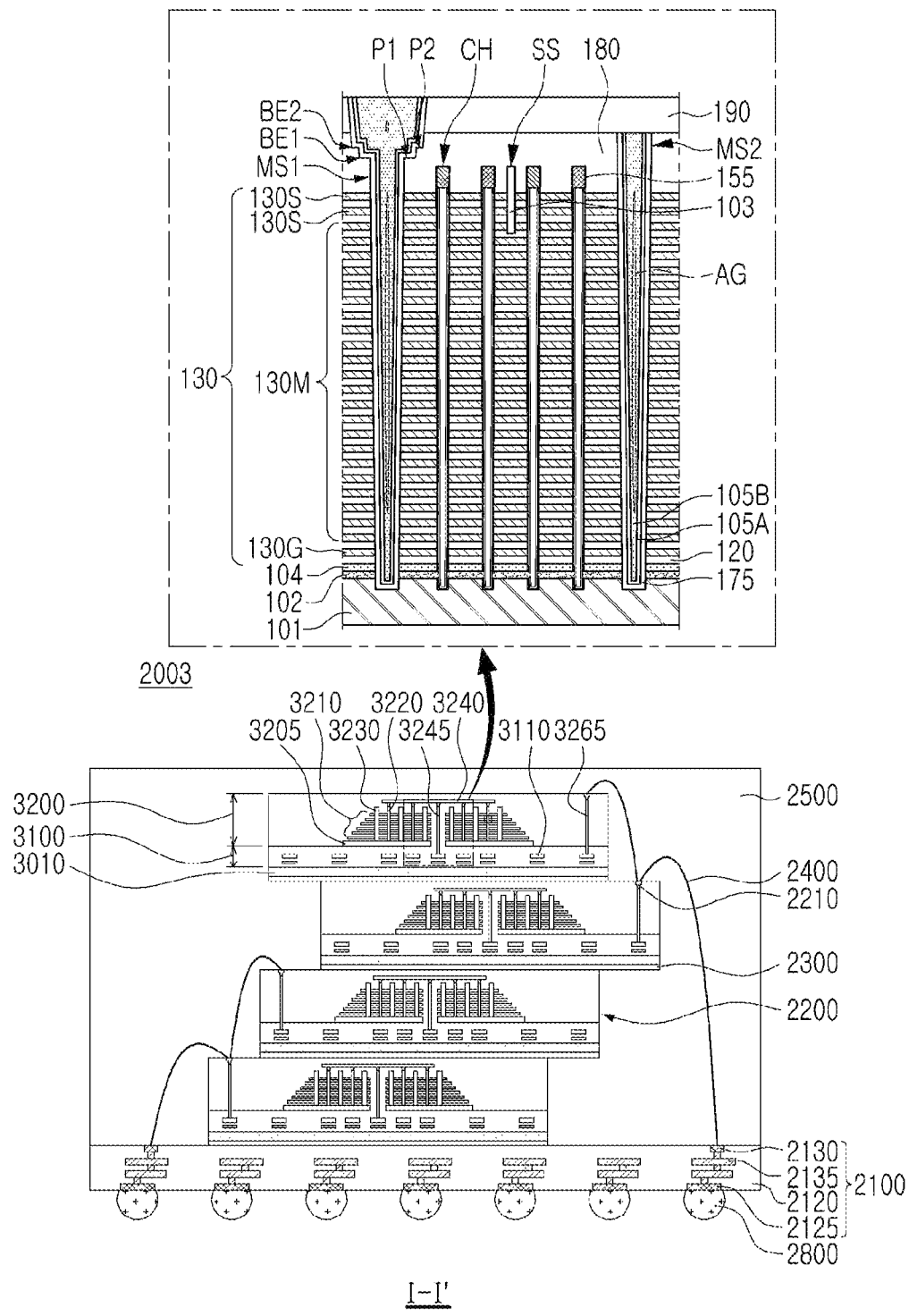
FIG. 12 is a cross-sectional view schematically illustrating a semiconductor package according to example embodiments of the present inventive concept.

FIG. 12 is a cross-sectional view schematically illustrating a semiconductor package according to example embodiments of the present inventive concept. FIG. 12 may illustrate the semiconductor package 2003 of FIG. 11 and may conceptually illustrate a region taken along line I-I' of the semiconductor package 2003 of FIG. 11.

Referring to FIG. 12, in the semiconductor package 2003, the package substrate 2100 may be a printed circuit board. The package substrate 2100 may include a package substrate body portion 2120, upper pads 2130 disposed on an upper surface of the package substrate body portion 2120 (see FIG. 11), lower pads 2125 disposed on a lower surface of the package substrate body portion 2120 or exposed from the lower surface, and internal wirings 2135 electrically connecting the upper pads 2130 and the lower pads 2125 in the package substrate body portion 2120. The upper pads 2130 may be electrically connected to the connection structures 2400. The lower pads 2125 may be connected to the wiring patterns 2005 of the main substrate 2001 of the data storage system 2000, as illustrated in FIG. 11, through conductive connection portions 2800.

Each of the semiconductor chips 2200 may include a semiconductor substrate 3010, and a first semiconductor structure 3100 and a second semiconductor structure 3200, sequentially stacked on the semiconductor substrate 3010. The first semiconductor structure 3100 may include a peripheral circuit region including peripheral wirings 3110. The second semiconductor structure 3200 may include a common source line 3205, a gate stack structure 3210 on the common source line 3205, channel structures 3220 and separation regions 3230, passing through the gate stack structure 3210, bit lines 3240 electrically connected to the memory channel structures 3220, and gate contact plugs 3235 electrically connected to word lines WL (see FIG. 10) of the gate stack structure 3210. As described above with reference to FIGS. 1A to 8, in each of the semiconductor chips 2200, first separation regions MS1 may further include a first bend portion BE1 and a second bend portion BE2 located in a position higher than the first bend portion BE1, and the second bend portion BE2 may be disposed in a position higher than uppermost surfaces of channel structures CH.

Each of the semiconductor chips 2200 may include a through-wiring 3245 electrically connected to the peripheral wirings 3110 of the first semiconductor structure 3100 and extending into the second semiconductor structure 3200. The through-wiring 3245 may be disposed outside the gate stack structure 3210 and may be further disposed to pass through the gate stack structure 3210. Each of the semiconductor chips 2200 may further include an input/output pad 2210 electrically connected to the peripheral wirings 3110 of the first semiconductor structure 3100 (see FIG. 11).

Since an opening of a separation region has a plurality of bend portions, a semiconductor device and a data storage system, having improved integration and reliability, may be provided.

As used herein, an element or region that is "covering" or "surrounding" or "filling" another element or region may completely or partially cover or surround or fill the other element or region. Further, as used herein the term "and/or" includes any and all combinations of one or more of the associated listed items.

Various advantages and effects of the present inventive concept are not limited to the above.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
a substrate;
gate electrode layers on the substrate and spaced apart from each other in a first direction that is perpendicular to an upper surface of the substrate;
interlayer insulating layers alternately stacked with the gate electrode layers on the substrate in the first direction;
channel structures extending through the gate electrode layers and the interlayer insulating layers, extending in the first direction, and including respective channel layers;
a cell region insulating layer on the gate electrode layers and the channel structures;
an upper support layer on the cell region insulating layer; and
separation regions extending through the gate electrode layers, the interlayer insulating layers, and the cell region insulating layer, extending in the first direction and in a second direction that is parallel to the upper surface of the substrate, and being spaced apart from each other in a third direction that is parallel to the upper surface of the substrate,
wherein each of the separation regions comprises a first separation region extending through the upper support layer and extending in the first direction and a second separation region extending between the substrate and a lower surface of the upper support layer in the first direction,
wherein the first separation region comprises a first region extending through the upper support layer, a second region extending through the cell region insulating layer, and a third region extending through the gate electrode layers,
wherein the first separation region further comprises a first bend portion in the second region and a second bend portion, and the first bend portion is between the substrate and the second bend portion, and
wherein uppermost surfaces of the channel structures are between the substrate and the second bend portion.

2. The semiconductor device of claim 1, wherein the first bend portion comprises a first surface that is parallel to the upper surface of the substrate, and
the second bend portion comprises a second surface that is parallel to the upper surface of the substrate.

3. The semiconductor device of claim 2, wherein the first separation region has a first width in the third direction at a height of the first surface and a second width in the third direction at a height of the second surface, and
wherein the first width is narrower than the second width.

4. The semiconductor device of claim 2, wherein each of the first surface and the second surface has a uniform width in a cross section taken in a plane parallel to the upper surface of the substrate.

5. The semiconductor device of claim 4, wherein the width of each of the first surface and the second surface is in a range of about 50 nm to about 100 nm.

6. The semiconductor device of claim 1, wherein the second bend portion is in the second region.

7. The semiconductor device of claim 1, wherein the second bend portion is in the first region.

8. The semiconductor device of claim 1, wherein the second bend portion comprises a plurality of second bend portions.

9. The semiconductor device of claim 8, wherein a first one of the plurality of second bend portions is in the first region, and a second one of the plurality of second bend portions is in the second region.

10. The semiconductor device of claim 1, wherein the first bend portion is between the substrate and the uppermost surfaces of the channel structures.

11. The semiconductor device of claim 1, wherein each of the separation regions further comprises:
a metal oxide layer that defines a side surface and a bottom surface of the separation region;
a first separation insulating layer on the metal oxide layer; and
a second separation insulating layer on the first separation insulating layer.

12. The semiconductor device of claim 1, wherein the first separation region comprises a plurality of first separation regions, and
wherein, in a cross section taken along the second direction, a ratio of a first length of an uppermost surface of each of the plurality of first separation regions to a second length between uppermost surfaces of directly adjacent ones of the plurality of first separation regions is in a range of about 0.8 to about 5.0.

13. A semiconductor device comprising:
a substrate;
gate electrode layers on the substrate and spaced apart from each other in a first direction that is perpendicular to an upper surface of the substrate;
interlayer insulating layers alternately stacked with the gate electrode layers on the substrate in the first direction;
channel structures extending through the gate electrode layers and the interlayer insulating layers, extending in the first direction, and including respective channel layers;
a cell region insulating layer on the gate electrode layers and the channel structures; and
separation regions extending through the gate electrode layers and the cell region insulating layer and extending in the first direction and in a second direction that is parallel to the upper surface of the substrate,
wherein each of the separation regions comprises a region extending through the cell region insulating layer and further comprises first and second surfaces that are parallel to upper surface of the substrate and are in the region, and
wherein the first surface is between the upper surface of the substrate and the second surface.

14. The semiconductor device of claim 13, further comprising an upper support layer on the cell region insulating layer,
wherein each of the separation regions comprises a first separation region extending through the upper support layer and a second separation region not extending through the upper support layer,
wherein the first separation region comprises a first region extending through the upper support layer, a second region extending through the cell region insulating layer, and a third region extending through the gate electrode layers, and
wherein the first surface and the second surface are in the second region.

15. The semiconductor device of claim 14, wherein the first separation region comprises at least one third surface in the first region that is parallel to the upper surface of the substrate.

16. The semiconductor device of claim 14, wherein the first separation region comprises at least one third surface in the second region that is parallel to the upper surface of the substrate.

17. The semiconductor device of claim 14, wherein each of the first surface and the second surface has a uniform width in a cross section taken in a plane parallel to the upper surface of the substrate.

18. The semiconductor device of claim 13, wherein the first surface has a first width in a cross section taken in a first plane parallel to the upper surface of the substrate, the second surface has a second width taken in a second plane parallel to the upper surface of the substrate, and the first width is narrower than the second width.

19. A data storage system comprising:
a semiconductor storage device including a substrate, circuit elements on a first side of the substrate, gate electrode layers on the substrate and spaced apart from each other in a first direction that is perpendicular to an upper surface of the substrate, interlayer insulating layers alternately stacked with the gate electrode layers on the substrate in the first direction, channel structures extending through the gate electrode layers and the interlayer insulating layers, extending in the first direction, and including respective channel layers, a cell region insulating layer on the gate electrode layers and the channel structures, separation regions extending through the gate electrode layers and the interlayer insulating layers, and extending in the first direction and in a second direction that is parallel to the upper surface of the substrate, and an input/output pad electrically connected to one of the circuit elements; and
a controller electrically connected to the semiconductor storage device through the input/output pad and configured to control the semiconductor storage device,
wherein each of the separation regions comprises a region extending through the cell region insulating layer and further comprises first and second surfaces that are parallel to the upper surface of the substrate and are in the region, and
wherein the first surface is between the upper surface of the substrate and the second surface.

20. The data storage system of claim 19, further comprising an upper support layer on the cell region insulating layer,
wherein each of the separation regions comprises a first separation region extending through the upper support layer and a second separation region not extending through the upper support layer,
wherein the first separation region comprises a first region extending through the upper support layer, a second region extending through the cell region insulating layer, and a third region extending through the gate electrode layers, and wherein the first surface and the second surface are in the second region.

\* \* \* \* \*